United States Patent
Iwasaki et al.

(10) Patent No.: US 7,408,429 B2
(45) Date of Patent: Aug. 5, 2008

(54) COUPLED FBAR FILTER

(75) Inventors: Tomohiro Iwasaki, Osaka (JP); Hiroshi Nakatsuka, Osaka (JP); Keiji Onishi, Osaka (JP); Hiroyuki Nakamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 299 days.

(21) Appl. No.: 11/453,064

(22) Filed: Jun. 15, 2006

(65) Prior Publication Data

US 2006/0284702 A1 Dec. 21, 2006

(30) Foreign Application Priority Data

Jun. 17, 2005 (JP) .............................. 2005-177728

(51) Int. Cl.
*H03H 9/00* (2006.01)
(52) U.S. Cl. .................... 333/191; 333/187; 333/189
(58) Field of Classification Search ................ 333/133, 333/187, 189, 191; 310/334
See application file for complete search history.

(56) References Cited

U.S. PATENT DOCUMENTS 7,053,730 B2 * 5/2006 Park et al. .................... 333/133
7,233,218 B2 * 6/2007 Park et al. .................... 333/133
2006/0202769 A1 * 9/2006 Nagao et al. ................... 331/73

FOREIGN PATENT DOCUMENTS

| JP | 10-145181 | 5/1998 |
| JP | 10-163804 | 6/1998 |
| WO | 2006/062082 | 6/2006 |

* cited by examiner

*Primary Examiner*—Daniel D Chang
(74) *Attorney, Agent, or Firm*—Wenderoth, Lind & Ponack, L.L.P.

(57) ABSTRACT

A coupled FBAR filter 100 includes first and second input/output vibration portions 110 and 111 respectively including first and second lower electrodes 104 and 106, first and second upper electrodes 105 and 107, and a piezoelectric thin film 103 interposed therebetween; and a cavity 102 for commonly guaranteeing vibrations of the first and second input/output vibration portions 110 and 111 so as to couple the vibrations. The first and second input/output vibration portions 110 and 111 are located adjacently in contact with each other with a step therebetween, such that the first and second lower electrodes 104 and 106 are not electrically connected to each other and such that the first and second upper electrodes 105 and 107 are not electrically connected to each other. Insulators 108 and 109 are provided in the vicinity of the step.

20 Claims, 18 Drawing Sheets

FIRST-ORDER MODE
DISPLACEMENT
DISTRIBUTION

THIRD-ORDER MODE
DISPLACEMENT
DISTRIBUTION ically to an FBAR filter using a plurality
of modes, and a duplexer and a communication device including the same.

COUPLED FBAR FILTER

BACKGROUND OF THE INVENTION

1. Field of the Invention

The present invention relates to a coupled FBAR filter usable for a radio frequency circuit of a wireless device or the like, and more particularly to an FBAR filter using a plurality of modes, and a duplexer and a communication device including the same.

2. Description of the Background Art

Conventionally, filters mounted on wireless communication devices such as cellar phones and the like include dielectric filters, laminated filters and acoustic filters. Known acoustic filters include a monolithic crystal filter (MCF) using a plurality of modes of a bulk wave and a surface acoustic wave filter (SAW filter). Recently, filters are required to have a smaller size, to provide a higher performance and to be usable at a higher frequency. As a device for fulfilling these requirements, a film bulk acoustic resonator filter (FBAR filter) using a bulk wave of a piezoelectric thin film has been developed.

A conventional MCF using a plurality of modes (Japanese Laid-Open Patent Publication No. 10-163804, FIG. 1) will be described. This type of MCF typically uses an AT cut crystal substrate. FIG. 26 shows a structure of the conventional MCF.

The MCF has the following structure. An AT cut crystal substrate 91 is photo-etched to integrally form a vibration portion 92 of a super thin plate and a thicker ring portion 93 for supporting the vibration portion 92. On a flat surface of the AT cut crystal substrate 91, electrodes 94a and 94b are provided with a gap g interposed therebetween. On the entirety of a surface of the AT cut crystal 91 having a recessed portion, an electrode 95 is applied by vapor deposition or the like. Owing to such a structure, a first-order mode and a second-order mode which are generated as a result of acoustic coupling between two electrode pairs, i.e., the electrode pair 94a/95 and the electrode pair 94b/95 can be used. The coupling degree of the two modes, i.e., the resonant frequency difference between the two modes depends on the elastic constant of the AT cut crystal substrate 91, the shapes of the electrodes, thicknesses of the electrodes, and the size of the gap g between the two electrode pairs. As the coupling degree is higher, a filter which has a smaller loss and is usable over a wider band can be realized.

Another MCF using a plurality of modes (Japanese Laid-Open Patent Publication No. 10-145181, FIG. 1) will be described. FIG. 27 shows a structure of the another conventional MCF.

The MCF includes three pairs of electrodes, i.e., an electrode pair 82/83, an electrode pair 84/85 and an electrode pair 86/87, each including the two electrodes facing each other with a crystal substrate 81 (piezoelectric substrate) interposed therebetween. The central electrode pair 84/85 is an input or an output. The two electrode pairs 82/83 and 86/87 located on the sides of the electrode pair 84/85 and having generally the same shape with each other are connected in parallel and act as an output or an input. The MCF excites a first-order mode thickness vibration and a third-order mode thickness vibration and thus realizes a high coupling degree of the plurality of modes. Thus, a filter usable over a wide band is realized.

A filter using an FBAR, which uses a piezoelectric thin film to be usable at a higher frequency, has been proposed. FIG. 28 shows a cross-sectional view of a conventional coupled FBAR filter using an FBAR and ideal vibration mode distributions thereof. The FBAR includes a lower electrode, a piezoelectric thin film, an upper electrode and the like stacked on a substrate by means of sputtering or the like, and thus has a different basic structure from that of an MCF.

As shown in FIG. 28, a coupled FBAR filter 70 includes two electrode pairs, i.e., an electrode pair 74/75 and an electrode pair 76/77, which are provided on a substrate 71 while interposing a piezoelectric thin film 73 therebetween. Owing to such a structure, two input/output vibration portions 78 and 79 are provided. The substrate 71 has a cavity 72 formed therein which is covered with the two input/output vibration portions 78 and 79. The cavity 72 is provided for guaranteeing vibrations of the two vibration portions 78 and 79. As means for guaranteeing the vibrations, an acoustic mirror layer may be used. Owing to this, the two input/output vibration portions 78 and 79 share the same cavity 72 or acoustic mirror layer, and function as a filter using the coupling of the first-order mode and the second-order mode. It is known that the coupling degree of the two modes is improved by reducing the sizes of the electrodes, the thicknesses of the electrodes, and the distance between the two input/output vibrations (two electrode pairs), so that the filter obtains smaller-loss and wider-band characteristics.

FIG. 29 shows a cross-sectional view of a conventional coupled FBAR filter for coupling a first-order mode and a third-order mode and ideal vibration mode distributions thereof. A coupled FBAR filter 60 shown in FIG. 29 includes three input/output vibration portions 61 through 63. Owing to this, a filter using the coupling of the first-order mode and the third-order mode is realized. It is known that the coupling degree of the two modes is improved by reducing the sizes of the electrodes, the thicknesses of the electrodes, and the distance between the three input/output vibrations (two electrode pairs), so that the filter obtains smaller-loss and wider-band characteristics.

An integral value of the vibration mode distributions curves shown in each of FIG. 28 and FIG. 29 is generally equivalent to the amount of charge generated in the piezoelectric thin film. By using the charge generated in the piezoelectric film for the vibration in the two or three vibration portions, the coupling coefficient of each vibration portion is increased and thus a coupled FBAR filter having smaller-loss and wider-band characteristics can be realized.

However, as shown in FIG. 28 and FIG. 29, the distance between the two or three input/output vibration portions (two or three electrode pairs) cannot reduced to less than a certain distance because the distance is restricted by the conditions for producing the electrodes. As a result, a part of the generated charge is consumed by a non-electrode portion as a loss, which deteriorates the filter characteristics.

SUMMARY OF THE INVENTION

Therefore, an object of the present invention is to provide a coupled FBAR filter efficiently using the generated charge in input/output vibration portions and having superb filter characteristics. Another object of the present invention is provide a ladder-type filter, a duplexer and a communication device using such a coupled FBAR filter.

The present invention is directed to a coupled FBAR filter. For attaining the above objects, the coupled FBAR filter according to the present invention comprises a vibration portion, a common vibration guaranteeing portion, and at least one insulator.

The vibration portion includes at least a first input/output vibration portion and a second input/output vibration portion which are located adjacently in contact with each other, wherein the first input/output vibration portion includes a first lower electrode, a first upper electrode, and a part of a piezoelectric portion interposed therebetween, and the second input/output vibration portion includes a second lower electrode, a second upper electrode, and a part of the piezoelectric portion interposed therebetween. The common vibration guaranteeing portion has the vibration portion provided thereon, and commonly guarantees at least a vibration of the first input/output vibration portion and a vibration of the second input/output vibration portion so as to couple the plurality of vibrations. The at least one insulator is used for forming a stepped portion for electrically insulating at least either the first lower electrode and the second lower electrode from each other, or the first upper electrode and the second upper electrode from each other.

Preferably, a first insulator which is thicker than the second lower electrode of the second input/output vibration portion is provided below the first lower electrode of the first input/output vibration portion; and a second insulator which is thicker than the first upper electrode of the first input/output vibration portion is provided on the second upper electrode of the second input/output vibration portion. The second insulator desirably has a thickness for making resonant frequencies of the first and second input/output vibration portions generally equal to each other. The second insulator may be provided onto a top surface of the first upper electrode. In this case, it is sufficient that the second insulator has a mass for making resonant frequencies of the first and second input/output vibration portions generally equal to each other.

Preferably, the first insulator is formed to have a shape insertable between the second lower electrode and the piezoelectric portion; and the second insulator is formed to have a shape insertable between the first upper electrode and the piezoelectric portion. It is sufficient that the first and second insulators have a mass for making resonant frequencies of the first and second input/output vibration portions generally equal to each other.

Preferably, the second insulator is provided onto a top surface of the first upper electrode. It is sufficient that the second insulator has a mass for making resonant frequencies of the first and second input/output vibration portions generally equal to each other.

The vibration portion may further include a third input/output vibration portion located adjacently in contact with the first input/output vibration portion and including a third lower electrode, a third upper electrode and a part of the piezoelectric portion interposed therebetween. In this case, the common vibration guaranteeing portion commonly guarantees vibrations of the first through third input/output vibration portions so as to couple the plurality of vibrations; a third insulator which is thicker than the first upper electrode of the first input/output vibration portion is provided on the third upper electrode of the third input/output vibration portion; and the first insulator is formed to be thicker than the third lower electrode of the third input/output vibration portion.

It is sufficient that the third insulator has a thickness for making resonant frequencies of the first and third input/output vibration portions generally equal to each other. The second and third insulators may be an integral layer provided onto the first upper electrode. The second and third insulators may have a mass for making resonant frequencies of the first through third input/output vibration portions generally equal to one another.

It is possible that the first lower electrode of the first input/output vibration portion and the second lower electrode of the second input/output vibration portion are electrically connected to each other; and that an insulator which is thicker than the first upper electrode of the first input/output vibration portion is provided on the second upper electrode of the second input/output vibration portion. The insulator desirably has a thickness for making resonant frequencies of the first and second input/output vibration portions generally equal to each other.

Typically, the common vibration guaranteeing portion is a cavity formed in a substrate, or an acoustic mirror layer including a high acoustic impedance layer and a low acoustic impedance layer located alternately.

The present invention may be provided as a ladder-type filter, a duplexer, or a communication device including the above-described coupled FBAR filter.

As described above, according to the present invention, the generated charge can be efficiently used, and smaller-loss and wider-band characteristics can be realized. Using such a coupled FBAR filter, the performance of the ladder-type filter, the duplexer and the communication device is improved.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
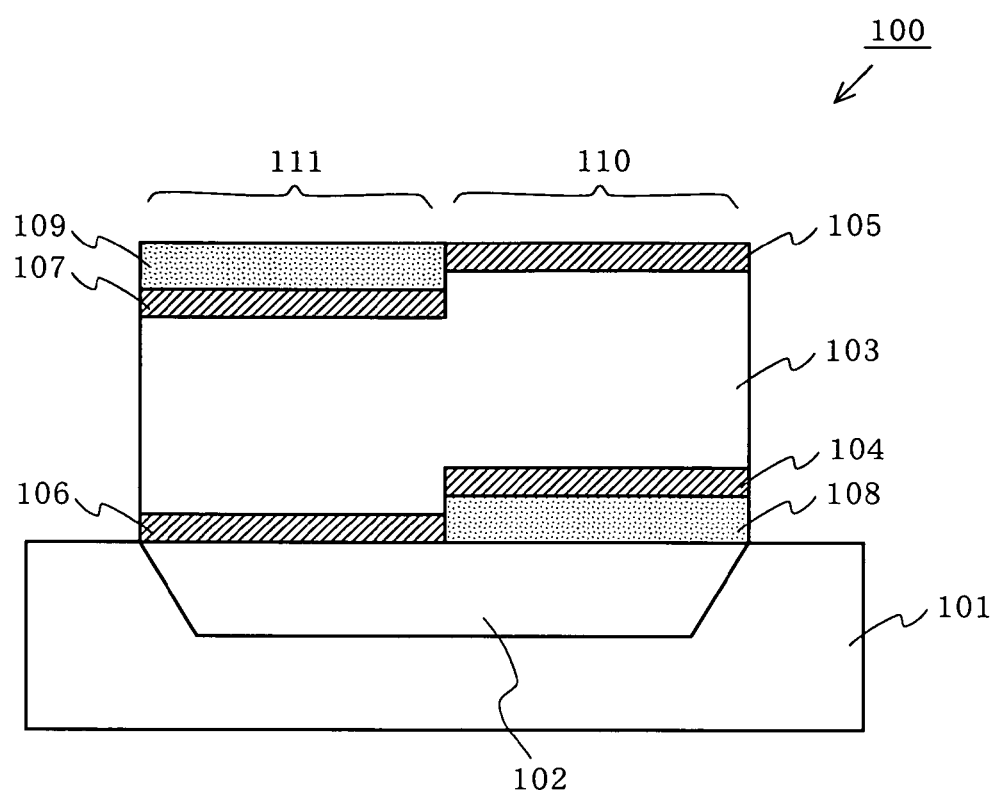
FIG. 1 is a cross-sectional view of a coupled FBAR filter 100 according to a first embodiment of the present invention.

FIG. 1 is a cross-sectional view of a coupled FBAR filter 100 according to a first embodiment of the present invention. As shown in FIG. 1, the coupled FBAR filter 100 includes a substrate 101, a cavity 102, a piezoelectric thin film 103, a first lower electrode 104, a first upper electrode 105, a second lower electrode 106, a second upper electrode 107, a first insulator 108, and a second insulator 109.

The first and second lower electrodes 104 and 106, and the first and second upper electrodes 105 and 107, are formed of, for example, molybdenum (Mo). The piezoelectric thin film 103 is formed of a piezoelectric material such as, for example, aluminum nitride (AlN). The first and second insulators 108 and 109 are formed of, for example, silicon dioxide ($SiO_2$).

First, a structure of the coupled FBAR filter 100 according to the first embodiment will be described in detail.

The first lower electrode 104, the first upper electrode 105, and a part of the piezoelectric thin film 103 interposed between these electrodes form a first input/output vibration portion 110. The second lower electrode 106, the second upper electrode 107, and a part of the piezoelectric thin film 103 interposed between these electrodes form a second input/output vibration portion 111. The first and second input/output vibration portions 110 and 111 form a vibration portion of the coupled FBAR filter 100. The terms "upper" and "lower" are used for the purpose of describing the structure easily and do not limit the positional relationship of the elements absolutely. The first insulator 108 is provided below the first input/output vibration portion 110. The second insulator 109 is provided on the second input/output vibration portion 111. The first and second input/output vibration portions 110 and 111 are provided on the substrate 101. The substrate 101 has the cavity 102 formed therein for confining the vibration.

Owing to the above-described structure, the first and second input/output vibration portions 110 and 111 exist in the same vibration area, are not mechanically separated from each other, and have a plurality of high-order modes, which would have nodes at both ends thereof in a horizontal direction in an ideal state. By using some vibration modes among the plurality of high-order modes, filter characteristics are obtained. The cavity 102 can be considered as a common vibration coupling portion for commonly guaranteeing the vibrations of the first and second input/output vibration portions 110 and 111 so as to couple these vibrations.

The structure of the coupling FBAR filter 100 has the following four features.

1. The first input/output vibration portion 110 and the second input/output vibration portion 111 are formed adjacently in contact with each other with no gap.

2. The first lower electrode 104 and the second lower electrode 106 are electrically insulated from each other.

3. The first upper electrode 105 and the second upper electrode 107 are electrically insulated from each other.

4. The resonant frequency of the first input/output vibration portion 110 in a thickness direction is generally equal to the resonant frequency of the second input/output vibration portion 111 in the thickness direction.

A condition for realizing the features 1 through 3 is to make the thickness of the first insulator 108 greater than the thickness of the second lower electrode 106. In a general production process, the amount of the piezoelectric thin film 103 stacked is managed by time. Therefore, the piezoelectric thin film 103 stacked on the first lower electrode 104 and the piezoelectric thin film 103 stacked on the second lower electrode 106 have an equal thickness. As a result, the difference in level between a top surface of the second lower electrode 106 and a top surface of the first lower electrode 104 usually appears as a surface step of the piezoelectric thin film 103. Another condition for realizing the features 1 through 3 is to make the thickness of the second upper electrode 107 smaller than the height of the surface step of the piezoelectric thin film 103. For realizing the feature 4, the thickness of the second insulator 109 is adjusted. For example, the level of a top surface of the second insulator 109 is made generally equal to the level of a top surface of the first input/output vibration portion 110 (a top surface of the first upper electrode 105).

Figure 2:
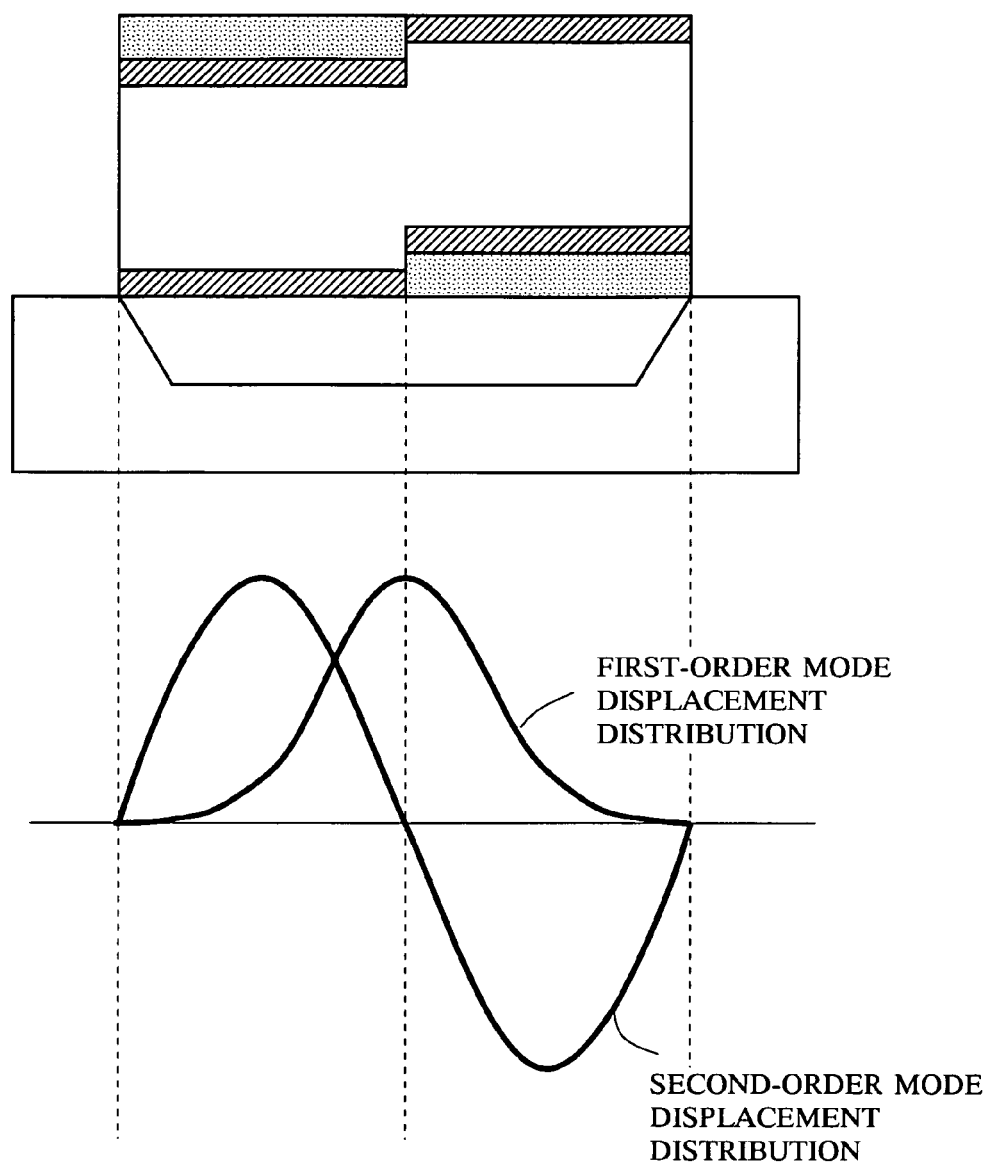
FIG. 2 shows vibration mode distributions of the coupled FBAR filter 100.
Figure 3:
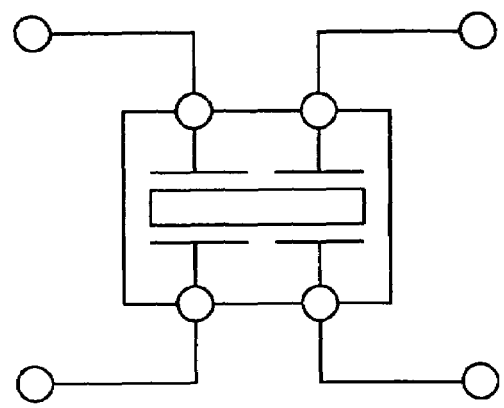
FIG. 3 shows a circuit formation representing a coupled FBAR filter.

Next, an operation of the coupling FBAR filter 100 according to first embodiment will be described. FIG. 2 shows vibration mode distributions of the coupled FBAR filter 100 according to the first embodiment. FIG. 3 shows a circuit formation representing the coupled FBAR filter 100 according to the first embodiment.

In the example of FIG. 2, one end surface of each of the first and second input/output vibration portions 110 and 111 is a fixed end, and high-order modes having nodes at both fixed ends are generated. Among the generated high-order modes, a first-order mode and a second-order mode are efficiently coupled together and provide filter characteristics. An integral value of the vibration mode distributions is equal to the amount of charge generated in the piezoelectric thin film 103. Accordingly, by adopting the structure in which the first and second input/output vibration portions 110 and 111 are adjacently in contact with each other with no gap, there occurs no non-electrode portion for causing a charge loss between the vibration portions. Thus, the generated charge can be efficiently used.

In addition, by adopting the structure in which the resonant frequency of the first input/output vibration portion 110 in the thickness direction is generally equal to the resonant frequency of the second input/output vibration portion 111 in the thickness direction, a vibration wave excited in the transverse direction is not confined in one vibration portion and can be propagated to the other vibration portion. Therefore, the vibration can be more efficiently excited in both the first and second input/output vibration portions 110 and 111. Thus, the coupling degree is improved, and smaller-loss and wider-band characteristics can be realized.

As described above, with the coupled FBAR filter 100 according to the first embodiment of the present invention, the first input/output vibration portion 110 and the second input/output vibration portion 111 are formed in accordance with the structural features 1 through 4, so that the two vibration modes are efficiently coupled. As a result, the generated charge can be efficiently used, and smaller-loss and wider-band characteristics can be realized.

Figure 4:
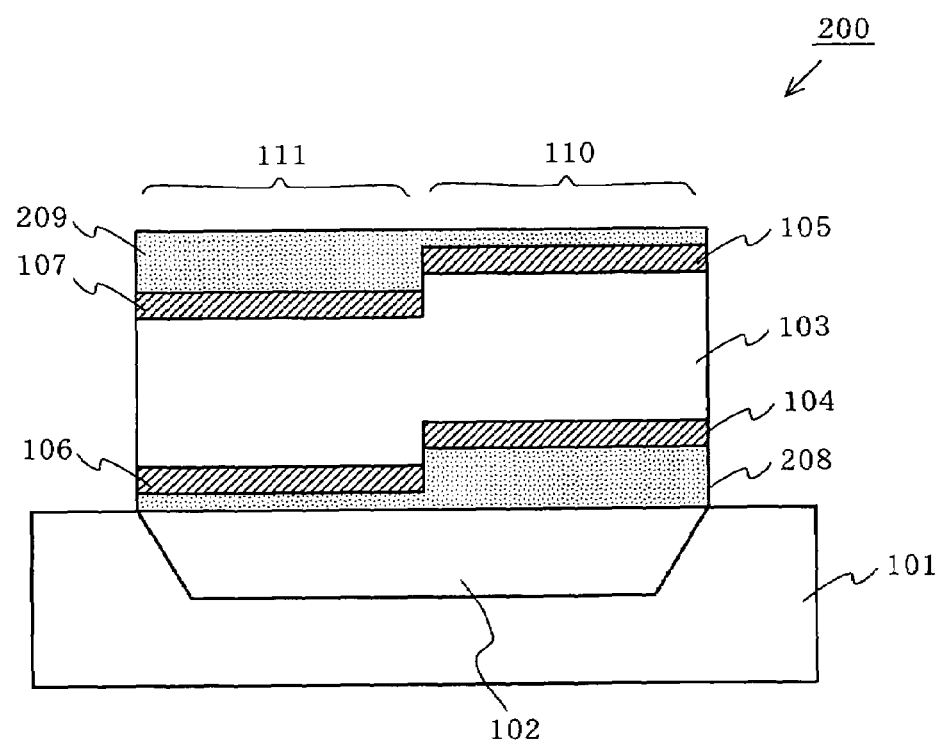
FIG. 4 is a cross-sectional view of a coupled FBAR filter 200 as a modification of the first embodiment.

As a modification of the first embodiment, a coupled FBAR filter 200 shown in FIG. 4, for example, is conceivable. The coupled FBAR filter 200 includes a first insulator 208 and a second insulator 209 covering both the first input/output vibration portion 110 and the second input/output vibration portion 111. The first insulator 208 is obtained as a result of integrating an insulator having a certain thickness which is newly inserted on a bottom surface of the first and the second input/output vibration portions 110 and 111 and the above-described first insulator 108. The second insulator 209 is obtained as a result of integrating an insulator having a certain thickness which is newly stacked on a top surface of the first and the second input/output vibration portions 110 and 111 and the above-described second insulator 109. The second insulator 209 is sufficient as long as having a mass which makes the resonant frequencies of the first and second input/output vibration portions 110 and 111 generally equal to each other. Needless to say, a combination of the first insulator 108 and the second insulator 209, or a combination of the first insulator 208 and the second insulator 109, is possible.

Second Embodiment

Figure 5:
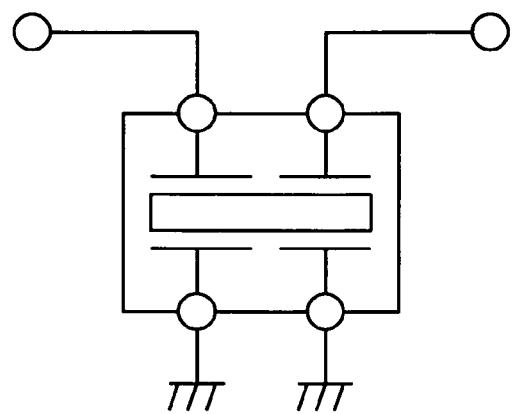
FIG. 5 shows another circuit formation representing a coupled FBAR filter.
Figure 8:
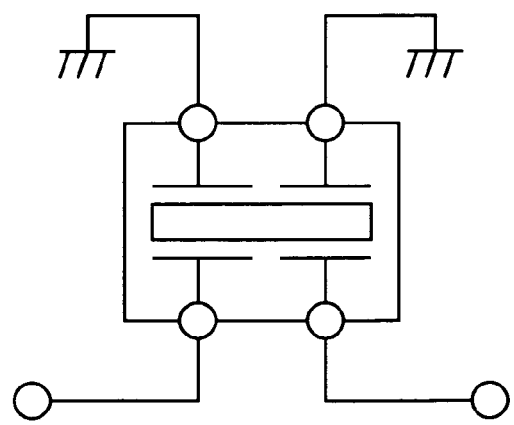
FIG. 8 is still another circuit formation representing a coupled FBAR filter.

In the first embodiment, the coupled FBAR filter suitable to a circuit (FIG. 3) in which the four electrodes 104 through 107 need to be insulated from one another is described. As shown in FIG. 5 and FIG. 8, a circuit in which two electrodes are grounded is often used for a coupled FBAR filter. In such a circuit, the two grounded electrodes do not need to be insulated. In other words, the feature 2 or the feature 3 does not need to be considered.

In a second embodiment, a coupled FBAR filter suitable to the circuit shown in FIG. 5 will be described.

Figure 6:
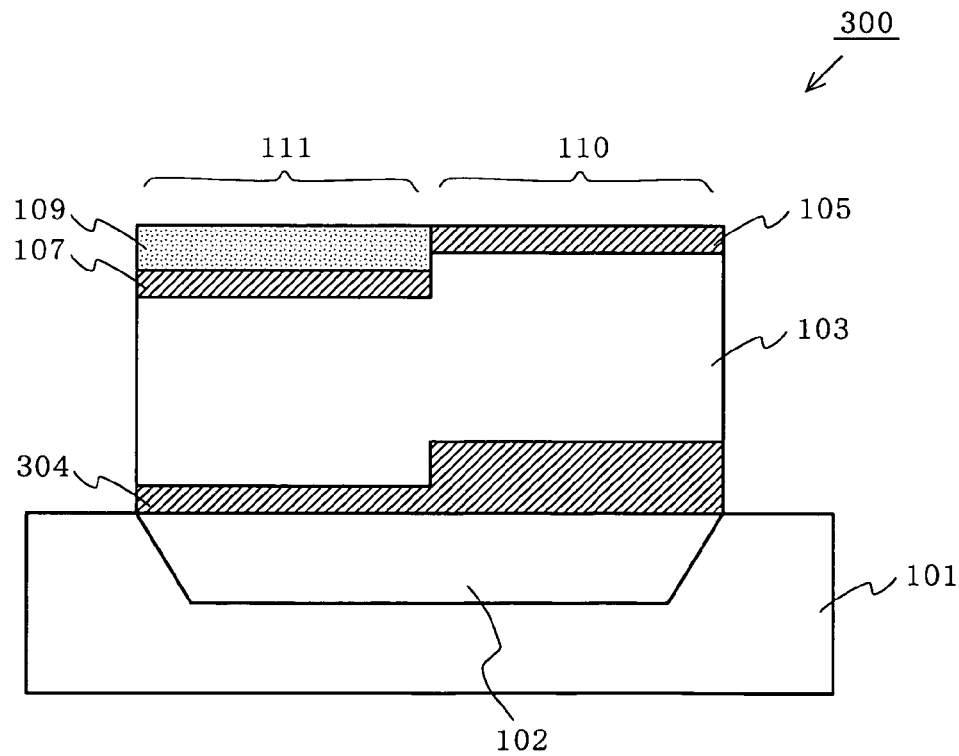
FIG. 6 is across-sectional view of a coupled FBAR filter 300 according to a second embodiment of the present invention.

FIG. 6 is a cross-sectional view of a coupled FBAR filter 300 according to the second embodiment of the present invention. As shown in FIG. 6, the coupled FBAR filter 300 includes a substrate 101, a cavity 102, a piezoelectric thin film 103, a lower electrode 304, a first upper electrode 105, a second upper electrode 107, and an insulator 109. As can be seen from FIG. 6, the second embodiment is different from the first embodiment in the structure of the lower electrode 304. Elements having an identical function to those of the first embodiment bear the same reference numerals thereto and the descriptions thereof will be omitted.

A part of the lower electrode 304, the first upper electrode 105, and a part of the piezoelectric thin film 103 interposed between these electrodes form a first input/output vibration portion 110. A part of the lower electrode 304, the second upper electrode 107, and a part of the piezoelectric thin film 103 interposed between these electrodes form a second input/output vibration portion 111. The lower electrode 304 has different thicknesses in the part included in the first input/output vibration portion 110 and in the part included in the second input/output vibration portion 111. In other words, the coupled FBAR filter 300 has a structure obtained as a result of changing the structure of the coupled FBAR filter 100 such that the first insulator 108 is changed to an electrode and integrated with the first and second lower electrodes 104 and 106.

As described above, with the coupled FBAR filter 300 according to the second embodiment of the present invention, the first input/output vibration portion 110 and the second input/output vibration portion 111 are formed in accordance with the structural features 1, 3 and 4, so that the two vibration modes are efficiently coupled. As a result, the generated charge can be efficiently used, and smaller-loss and wider-band characteristics can be realized.

Figure 7:
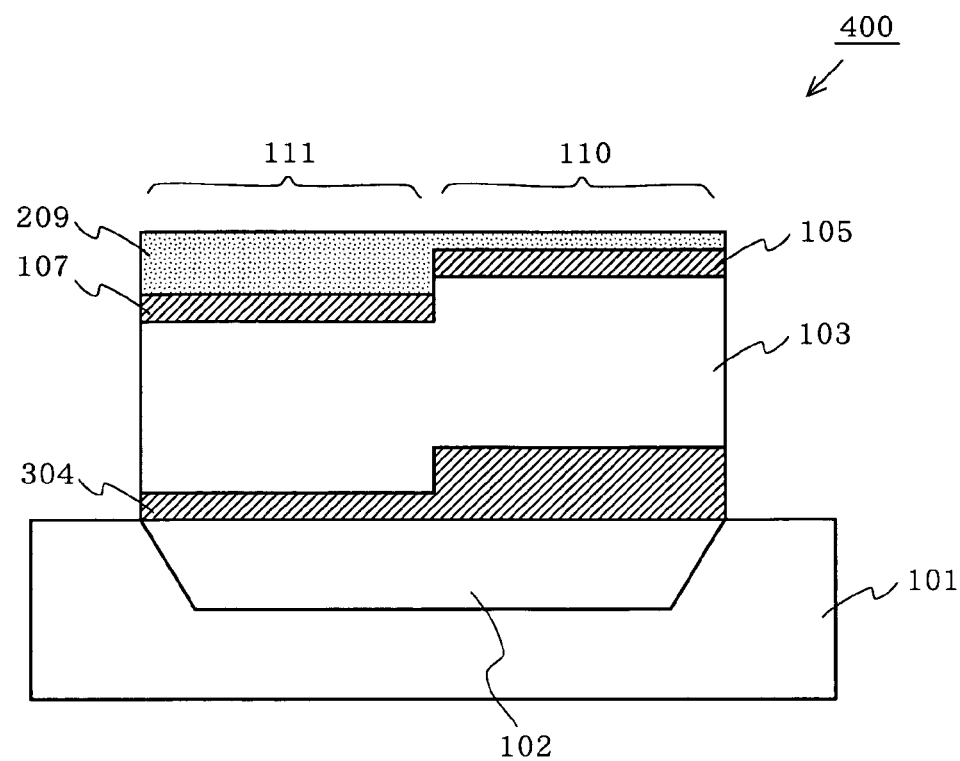
FIG. 7 is a cross-sectional view of a coupled FBAR filter 400 as a modification of the second embodiment.

As a modification of the second embodiment, a coupled FBAR filter 400 shown in FIG. 7, for example, is conceivable. The coupled FBAR filter 400 includes an insulator 209 covering both the first input/output vibration portion 110 and the second input/output vibration portion 111. The insulator 209 is obtained as a result of integrating an insulator having a certain thickness which is newly stacked on a top surface of the first and the second input/output vibration portions 110 and 111 and the above-described insulator 109. The insulator 209 is sufficient as long as having a mass which makes the resonant frequencies of the first and second input/output vibration portions 110 and 111 generally equal to each other.

Third Embodiment

In a third embodiment, a coupled FBAR filter suitable to the circuit shown in FIG. 8 will be described.

Figure 9:
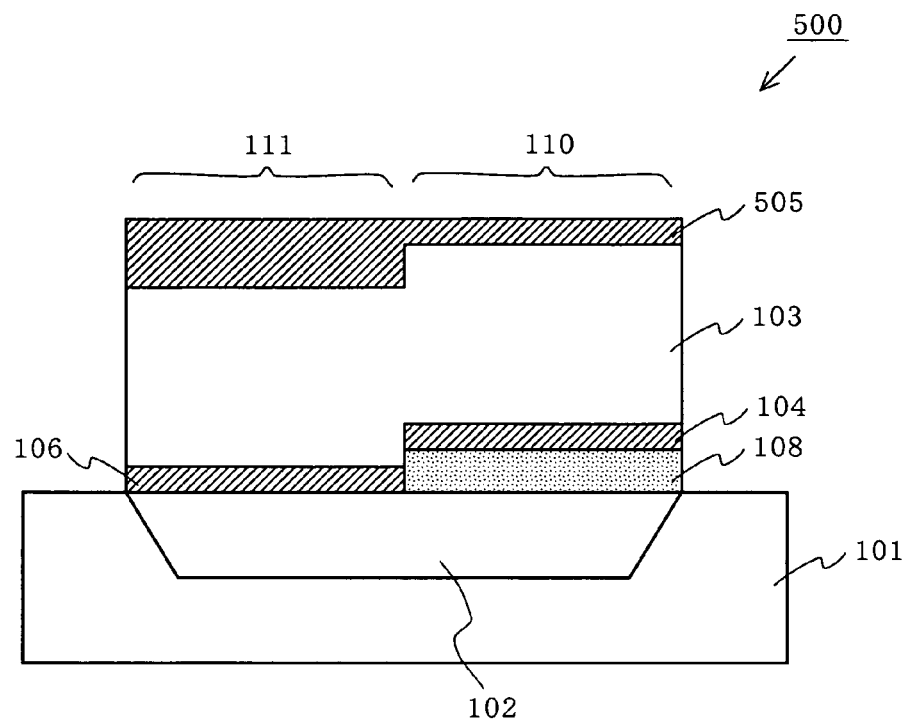
FIG. 9 is a cross-sectional view of a coupled FBAR filter 500 according to a third embodiment of the present invention.

FIG. 9 is a cross-sectional view of a coupled FBAR filter 500 according to the third embodiment of the present invention. As shown in FIG. 9, the coupled FBAR filter 500 includes a substrate 101, a cavity 102, a piezoelectric thin film 103, a first lower electrode 104, a second lower electrode 106, an upper electrode 505, and an insulator 108. As can be seen from FIG. 9, the third embodiment is different from the first embodiment in the structure of the upper electrode 505. Elements having an identical function to those of the first embodiment bear the same reference numerals thereto and the descriptions thereof will be omitted.

The first lower electrode 104, a part of the upper electrode 505, and a part of the piezoelectric thin film 103 interposed between these electrodes form a first input/output vibration portion 110. The second lower electrode 106, a part of the upper electrode 505, and a part of the piezoelectric thin film 103 interposed between these electrodes form a second input/output vibration portion 111. The upper electrode 505 has different thicknesses in the part included in the first input/output vibration portion 110 and in the part included in the second input/output vibration portion 111. In other words, the coupled FBAR filter 500 has a structure obtained as a result of changing the structure of the coupled FBAR filter 100 such that the second insulator 109 is changed to an electrode and integrated with the first and second upper electrodes 105 and 107.

As described above, with the coupled FBAR filter 500 according to the third embodiment of the present invention, the first input/output vibration portion 110 and the second input/output vibration portion 111 are formed in accordance with the structural features 1, 2 and 4, so that the two vibration modes are efficiently coupled. As a result, the generated charge can be efficiently used, and smaller-loss and wider-band characteristics can be realized.

Figure 10:
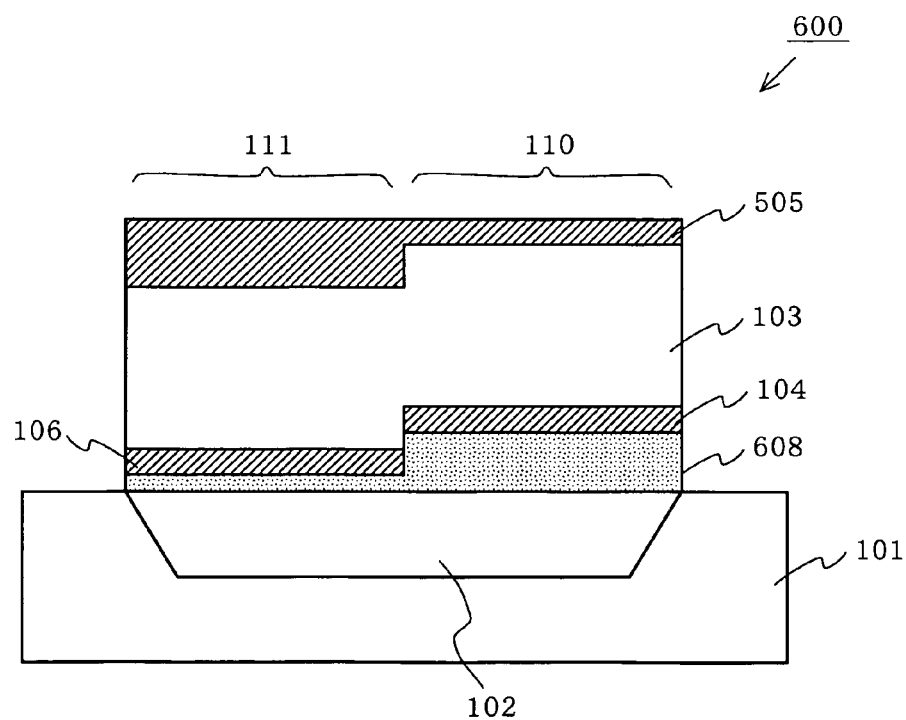
FIG. 10 is a cross-sectional view of a coupled FBAR filter 600 as a modification of the third embodiment.

As a modification of the third embodiment, a coupled FBAR filter 600 shown in FIG. 10, for example, is conceivable. The coupled FBAR filter 600 includes an insulator 608 covering both the first input/output vibration portion 110 and the second input/output vibration portion 111. The insulator 608 is obtained as a result of integrating an insulator having a certain thickness which is newly inserted on a bottom surface of the first and the second input/output vibration portions 110 and 111 and the above-described insulator 108.

Fourth Embodiment

In a fourth embodiment, another modification of the first embodiment above will be described.

Figure 11:
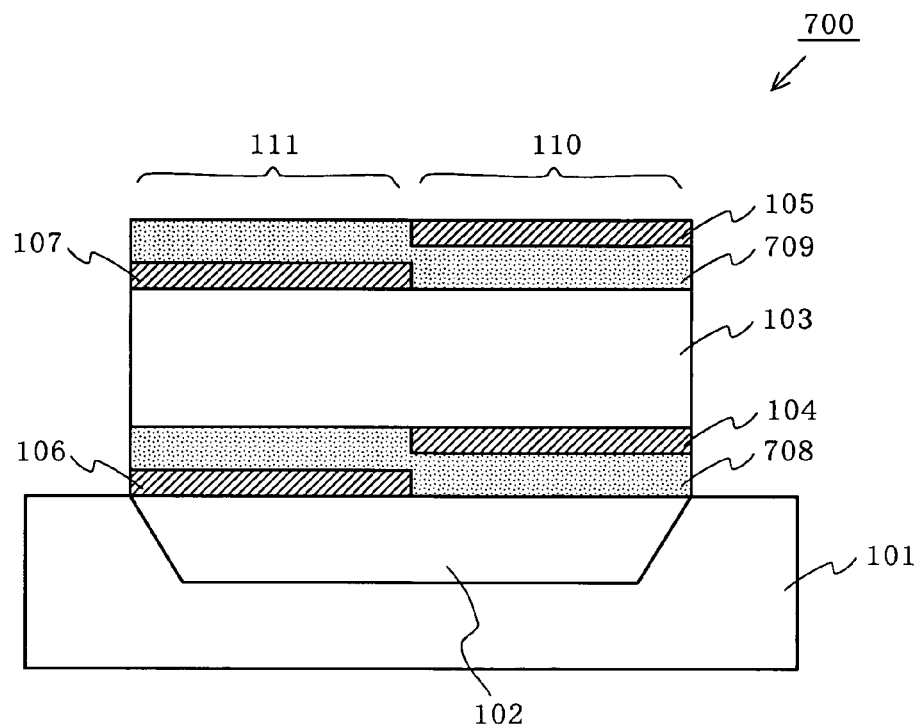
FIG. 11 is a cross-sectional view of a coupled FBAR filter 700 according to a fourth embodiment of the present invention.

FIG. 11 is a cross-sectional view of a coupled FBAR filter 700 according to the fourth embodiment of the present invention. As shown in FIG. 11, the coupled FBAR filter 700 includes a substrate 101, a cavity 102, a piezoelectric thin film 103, a first lower electrode 104, a second lower electrode 106, a first upper electrode 105, a second upper electrode 107, a first insulator 708, and a second insulator 709. As can be seen from FIG. 11, the fourth embodiment is different from the first embodiment in the structure of the first insulator 708 and the second insulator 709. Elements having an identical function to those of the first embodiment bear the same reference numerals thereto and the descriptions thereof will be omitted.

The first insulator 708 is formed from the level of a top surface of the first lower electrode 104 to the level of a bottom surface of the second lower electrode 106. The first insulator 708, the first lower electrode 104 and the second lower electrode 106 are designed to fulfill the feature 2. The second insulator 709 is formed from the level of a top surface of the first upper electrode 105 to the level of a bottom surface of the second upper electrode 107. The second insulator 709, the first upper electrode 105 and the second upper electrode 107 are designed to fulfill the feature 3.

As described above, with the coupled FBAR filter 700 according to the fourth embodiment of the present invention, the first input/output vibration portion 110 and the second input/output vibration portion 111 are formed in accordance with the structural features 1 through 4, so that the two vibration modes are efficiently coupled. As a result, the generated charge can be efficiently used, and smaller-loss and wider-band characteristics can be realized.

Figure 12:
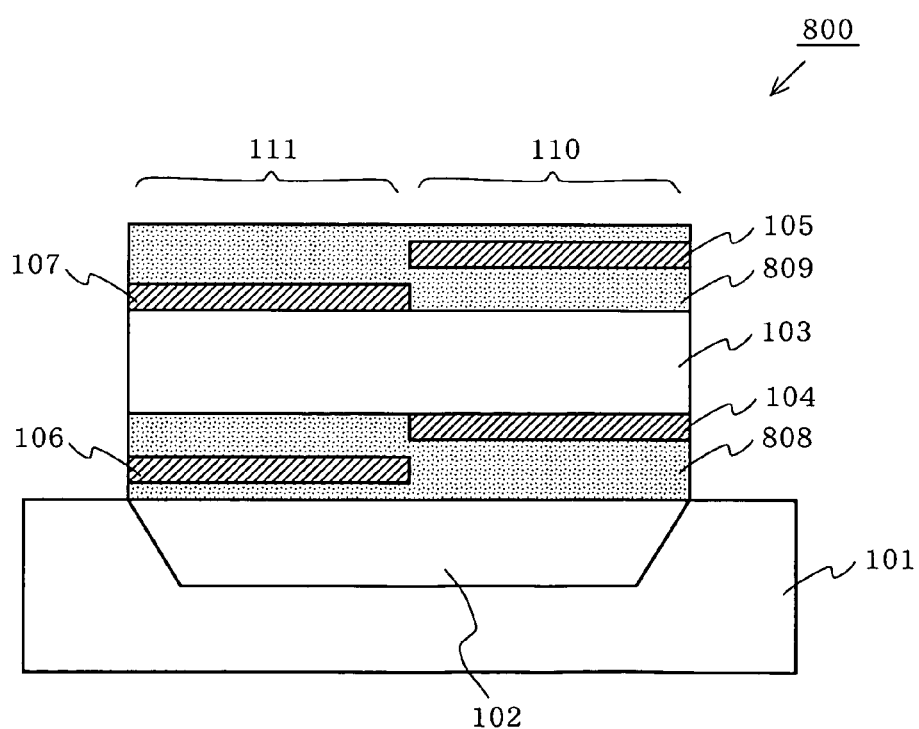
FIG. 12 is a cross-sectional view of a coupled FBAR filter 800 as a modification of the fourth embodiment.

As a modification of the fourth embodiment, a coupled FBAR filter 800 shown in FIG. 12, for example, is conceivable. The coupled FBAR filter 800 includes a first insulator 808 and a second insulator 809 covering both the first input/output vibration portion 110 and the second input/output vibration portion 111. The first insulator 808 is obtained as a result of integrating an insulator having a certain thickness which is newly inserted on a bottom surface of the first and the second input/output vibration portions 110 and 111 and the above-described first insulator 708. The second insulator 809 is obtained as a result of integrating an insulator having a certain thickness which is newly stacked on a top surface of the first and the second input/output vibration portions 110 and 111 and the above-described second insulator 709. The second insulator 809 is sufficient as long as having a mass which makes the resonant frequencies of the first and second input/output vibration portions 110 and 111 generally equal to each other. Needless to say, a combination of the first insulator 708 and the second insulator 809, or a combination of the first insulator 808 and the second insulator 709, is possible.

Figure 22:
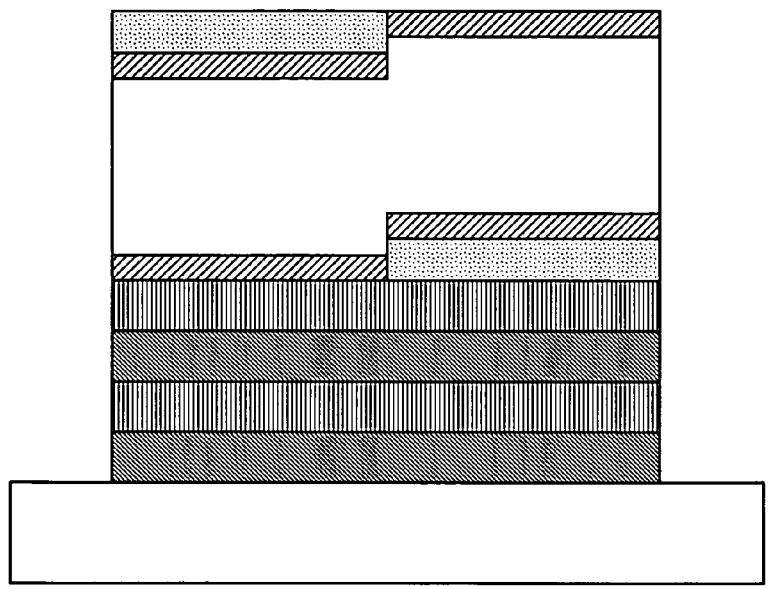
FIG. 22 is a cross-sectional view of a coupled FBAR filter according to the present invention using a mirror acoustic layer.

In the coupled FBAR filters described in the first through fourth embodiments, an acoustic mirror layer including a low acoustic impedance layer and a high acoustic impedance layer located alternately may be used instead of the cavity 102. FIG. 22 shows an exemplary structure of the coupled FBAR filter 100 according to the first embodiment in which the acoustic mirror layer is used. Substantially the same effect is provided. In at least one of the first input/output vibration portion 110 and the second input/output vibration portion 111, the lower electrode 104 or 106 and the upper electrode 105 or 107 may be balanced input/output terminal electrodes. With such a structure, a balanced coupled FBAR filter can be realized.

Fifth Embodiment

In the first through fourth embodiments, examples of a coupled FBAR filter having two input/output vibration portions are described. According to the present invention, a coupled FBAR filter having three input/output vibration portions can be easily constructed.

In fifth through eighth embodiments below, coupled FBAR filters having three input/output vibration portions will be described.

Figure 13:
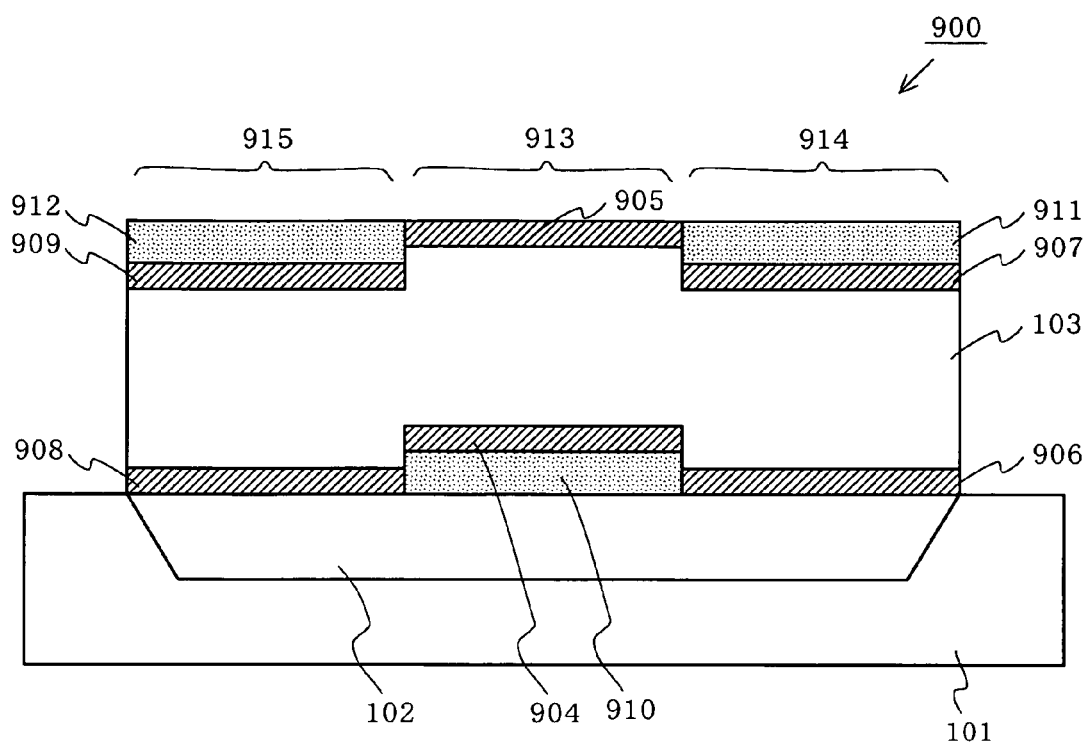
FIG. 13 is a cross-sectional view of a coupled FBAR filter 900 according to a fifth embodiment of the present invention.

FIG. 13 is a cross-sectional view of a coupled FBAR filter 900 according to a fifth embodiment of the present invention. As shown in FIG. 13, the coupled FBAR filter 900 includes a substrate 101, a cavity 102, a piezoelectric thin film 103, a first lower electrode 904, a first upper electrode 905, a second lower electrode 906, a second upper electrode 907, a third lower electrode 908, a third upper electrode 909, a first insulator 910, a second insulator 911, and a third insulator 912.

The first through third lower electrodes 904, 906 and 908, and the first through third upper electrodes 905, 907 and 909, are formed of, for example, molybdenum. The piezoelectric thin film 103 is formed of a piezoelectric material such as, for example, aluminum nitride. The first through third insulators 910 through 912 are formed of, for example, silicon dioxide.

First, a structure of the coupled FBAR filter 900 according to the fifth embodiment will be described in detail.

The first lower electrode 904, the first upper electrode 905, and a part of the piezoelectric thin film 103 interposed between these electrodes form a first input/output vibration portion 913. The second lower electrode 906, the second upper electrode 907, and a part of the piezoelectric thin film 103 interposed between these electrodes form a second input/output vibration portion 914. The third lower electrode 908, the third upper electrode 909, and a part of the piezoelectric thin film 103 interposed between these electrodes form a third input/output vibration portion 915. The first through third input/output vibration portions 913 through 915 form a vibration portion of the coupled FBAR filter 900. The first through third input/output vibration portions 913 through 915 are provided on the substrate 101. The substrate 101 has the cavity 102 formed therein for confining the vibration.

Owing to the above-described structure, the first through third input/output vibration portions 913 through 915 exist in the same vibration area, are not mechanically separated from each other, and have a plurality of high-order modes, which would have nodes at both ends thereof in a horizontal direction in an ideal state. By using some vibration modes among the plurality of high-order modes, filter characteristics are obtained. The cavity 102 can be considered as a common vibration coupling portion for commonly guaranteeing the vibrations of the first through third input/output vibration portions 913 through 915 so as to couple these vibrations.

The structure of the coupling FBAR filter 900 has the following four features.

1. The first through third input/output vibration portions 913 through 915 are formed adjacently in contact with each other with no gap.

2. The first through third lower electrode 904, 906 and 908 are electrically insulated from each other.

3. The first through third upper electrode 905, 907 and 909 are electrically insulated from each other.

4. The resonant frequency of the first input/output vibration portion 913 in a thickness direction, the resonant frequency of the second input/output vibration portion 914 in the thickness direction, and the resonant frequency of the third input/output vibration portion 915 in the thickness direction are generally equal to one another.

A condition for realizing the features 1 through 3 is to make the thickness of the first insulator 910 greater than the thickness of the second and third lower electrodes 906 and 908. In a general production process, the amount of the piezoelectric thin film 103 stacked is managed by time. Therefore, the piezoelectric thin film 103 stacked on the first lower electrode 904 and the piezoelectric thin film 103 stacked on the second and third lower electrodes 906 and 908 have an equal thickness. As a result, the difference in level between a top surface of the second and third lower electrodes 906 and 908 and a top surface of the first lower electrode 904 usually appears as a surface step of the piezoelectric thin film 103. Another condition for realizing the features 1 through 3 is to make the thickness of the second and third upper electrodes 907 and 909 smaller than the height of the surface step of the piezoelectric thin film 103. For realizing the feature 4, the thickness of the second and third insulators 911 and 912 is adjusted. For example, the level of a top surface of the second and third insulators 911 and 912 is made generally equal to the level of a top surface of the first input/output vibration portion 910 (a top surface of the first upper electrode 905).

Figure 14:
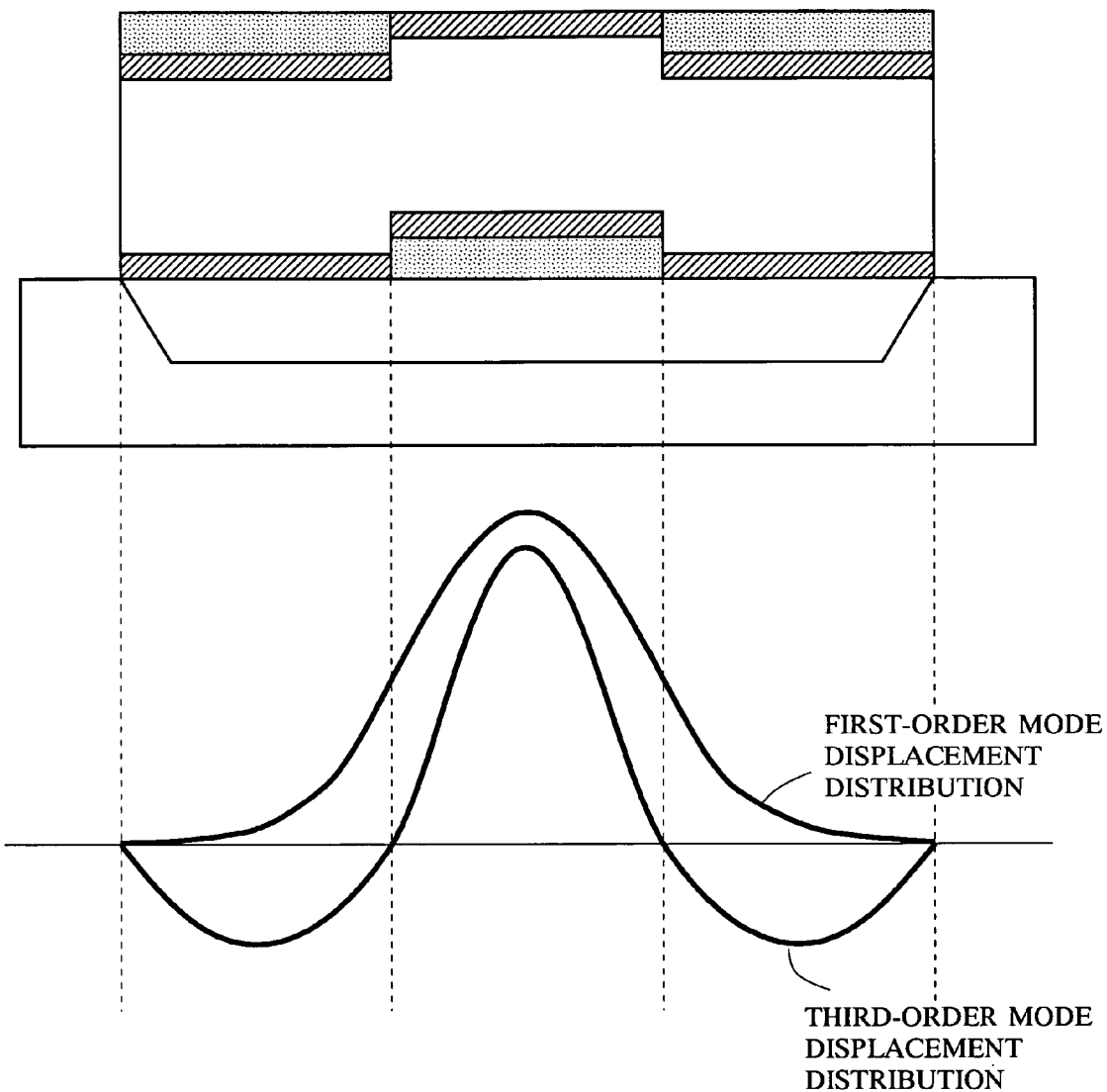
FIG. 14 shows vibration mode distributions of the coupled FBAR filter 900.

Next, an operation of the coupling FBAR filter 900 according to fifth embodiment will be described. FIG. 14 shows vibration mode distributions of the coupled FBAR filter 900 according to the fifth embodiment.

In the example of FIG. 14, one end surface of each of the second and third input/output vibration portions 914 and 915 is a fixed end, and high-order modes having nodes at both fixed ends are generated. Among the generated high-order modes, a first-order mode and a third-order mode are efficiently coupled together and provide filter characteristics. An integral value of the vibration mode distributions is equal to the amount of charge generated in the piezoelectric thin film 103. Accordingly, by adopting the structure in which the first through third input/output vibration portions 913 through 915 are adjacently in contact with each other with no gap, there occurs no non-electrode portion for causing a charge loss between the vibration portions. Thus, the generated charge can be efficiently used.

In addition, by adopting the structure in which the resonant frequency of the first input/output vibration portion 913 in the thickness direction, the resonant frequency of the second input/output vibration portion 914 in the thickness direction, and the resonant frequency of the third input/output vibration portion 915 in the thickness direction are generally equal to one another, a vibration wave excited in the transverse direction is not confined in a part of the vibration portion and can be propagated to the other parts of the vibration portion. Therefore, the vibration can be more efficiently excited in the first through third input/output vibration portions 913 through 915. Thus, the coupling degree is improved, and smaller-loss and wider-band characteristics can be realized.

As described above, with the coupled FBAR filter 900 according to the fifth embodiment of the present invention, the first through third input/output vibration portions 913 through 915 are formed in accordance with the structural features 1 through 4, so that the two vibration modes are efficiently coupled. As a result, the generated charge can be efficiently used, and smaller-loss and wider-band characteristics can be realized.

Figure 15:
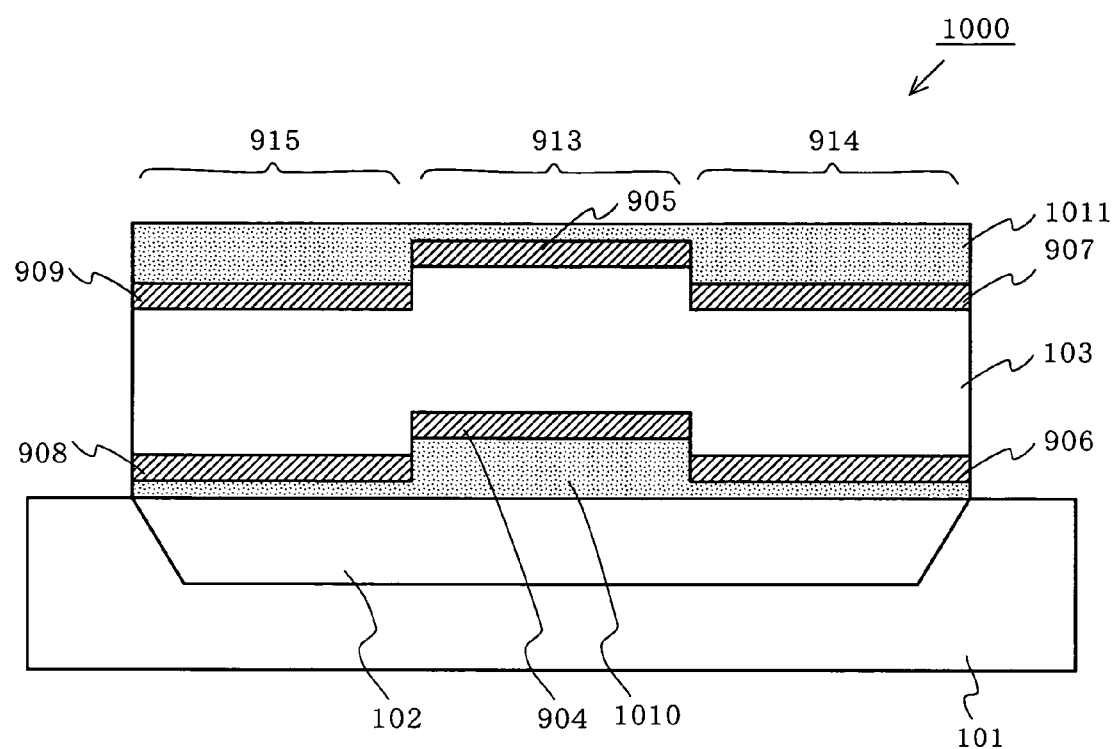
FIG. 15 is a cross-sectional view of a coupled FBAR filter 1000 as a modification of the fifth embodiment.

As a modification of the fifth embodiment, a coupled FBAR filter 1000 shown in FIG. 15, for example, is conceivable. The coupled FBAR filter 1000 includes a first insulator 1010 and a second insulator 1011 covering the first through third input/output vibration portions 913 through 915. The first insulator 1010 is obtained as a result of integrating an insulator having a certain thickness which is newly inserted on a bottom surface of the first through third input/output vibration portions 913 through 915 and the above-described first insulator 910. The second insulator 1011 is obtained as a result of integrating an insulator having a certain thickness which is newly stacked on a top surface of the first through third input/output vibration portions 913 through 915 and the above-described second and third insulators 911 and 912. The second insulator 1011 is sufficient as long as having a mass which makes the resonant frequencies of the first through third input/output vibration portions 913 through 915 generally equal to one another.

Sixth Embodiment

Figure 16:
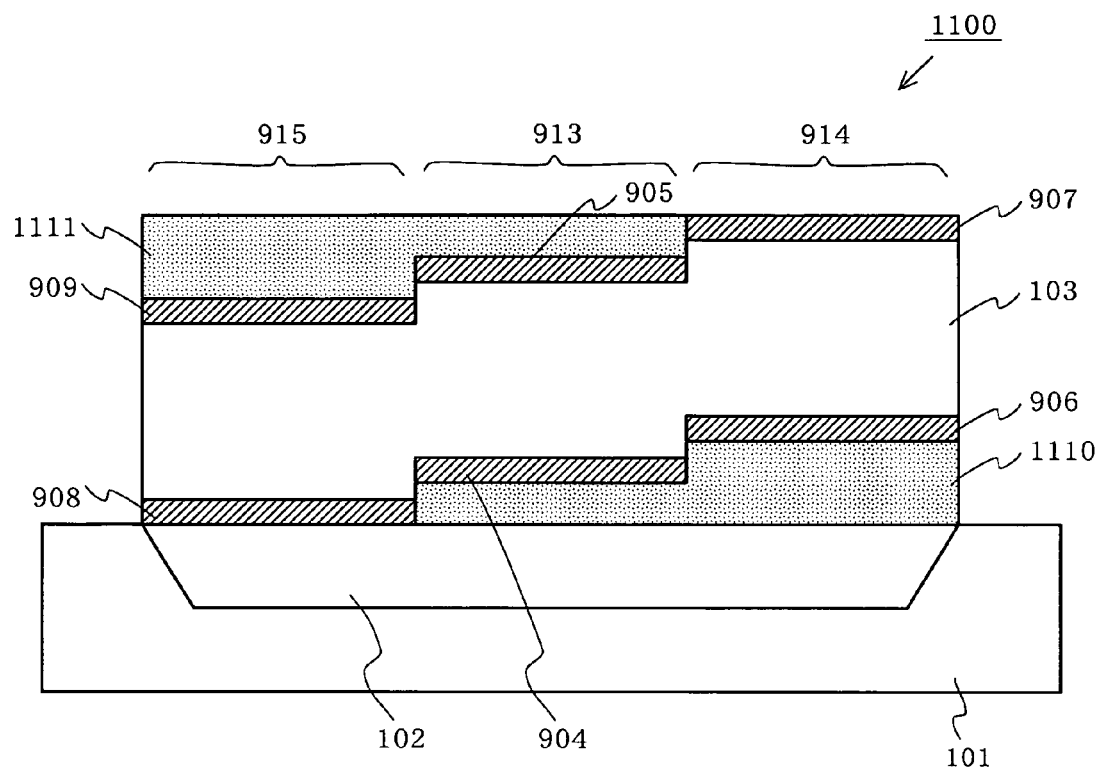
FIG. 16 is a cross-sectional view of a coupled FBAR filter 1100 according to a sixth embodiment of the present invention.

FIG. 16 is a cross-sectional view of a coupled FBAR filter 1100 according to a sixth embodiment of the present invention. As shown in FIG. 16, the coupled FBAR filter 1100 includes a substrate 101, a cavity 102, a piezoelectric thin film 103, a first lower electrode 904, a second lower electrode 906, a third lower electrode 908, a first upper electrode 905, a second upper electrode 907, a third upper electrode 909, a first insulator 1110, and a second insulator 1111. As can be seen from FIG. 16, the sixth embodiment is different from the fifth embodiment in the structure of the first and second insulators 1110 and 1111. In FIG. 16, elements having an identical function to those of the fifth embodiment bear the same reference numerals thereto and the descriptions thereof will be omitted.

The first lower electrode 904, the first upper electrode 905, and a part of the piezoelectric thin film 103 interposed between these electrodes form a first input/output vibration portion 913. The second lower electrode 906, the second upper electrode 907, and a part of the piezoelectric thin film 103 interposed between these electrodes form a second input/output vibration portion 914. The third lower electrode 908, the third upper electrode 909, and a part of the piezoelectric thin film 103 interposed between these electrodes form a third input/output vibration portion 915. The first insulator 1110 is formed to be stepped only on a bottom surface of the first lower electrode 904 and the second lower electrode 906. The thickness of each step is designed to fulfill the feature 2. The second insulator 1111 is formed to be stepped only on a top surface of the first upper electrode 905 and the third upper electrode 909. The thickness of each step is designed to fulfill the feature 3.

As described above, with the coupled FBAR filter 1100 according to the sixth embodiment of the present invention, the first through third input/output vibration portions 913 through 915 are formed in accordance with the structural features 1 through 4, so that the two vibration modes are efficiently coupled. As a result, the generated charge can be efficiently used, and smaller-loss and wider-band characteristics can be realized.

Figure 17:
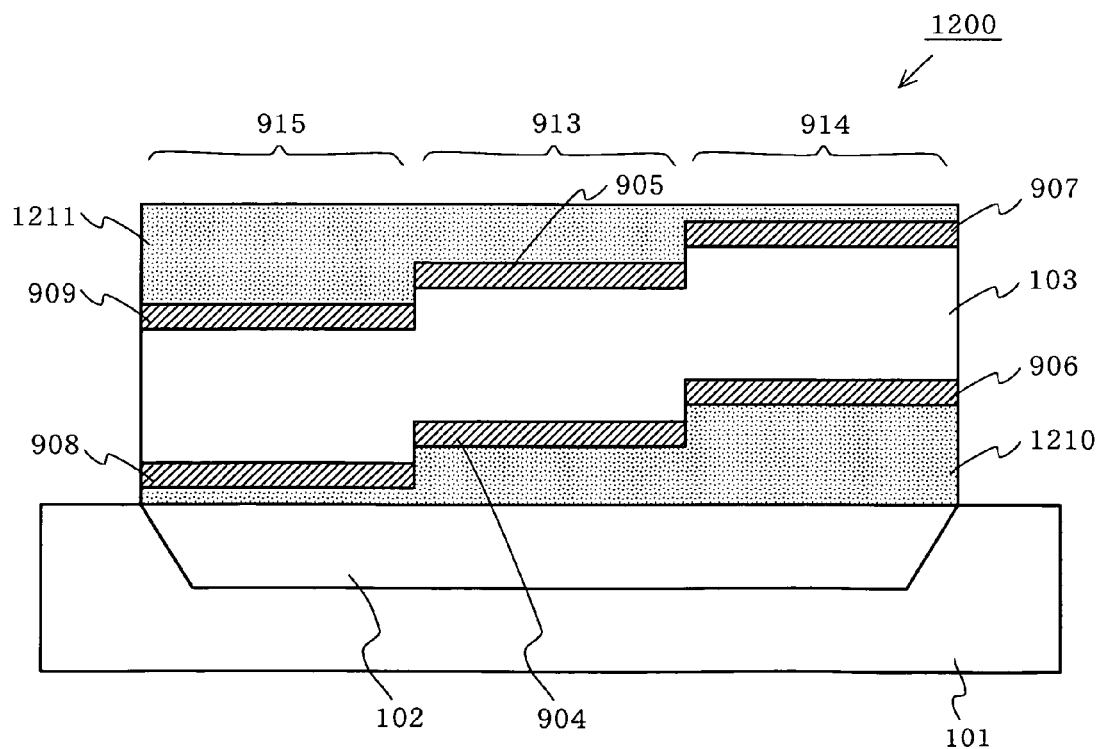
FIG. 17 is a cross-sectional view of a coupled FBAR filter 1200 as a modification of the sixth embodiment.

As a modification of the sixth embodiment, a coupled FBAR filter 1200 shown in FIG. 17, for example, is conceivable. The coupled FBAR filter 1200 includes a first insulator 1210 and a second insulator 1211 covering the first through third input/output vibration portions 913 through 915. The first insulator 1210 is obtained as a result of integrating an insulator having a certain thickness which is newly inserted on a bottom surface of the first through third input/output vibration portions 913 through 915 and the above-described first insulator 1110. The second insulator 1211 is obtained as a result of integrating an insulator having a certain thickness which is newly stacked on a top surface of the first through third input/output vibration portions 913 through 915 and the above-described second insulator 1111. The second insulator 1211 is sufficient as long as having a mass which makes the resonant frequencies of the first through third input/output vibration portions 913 through 915 generally equal to one another.

Seventh Embodiment

Figure 18:
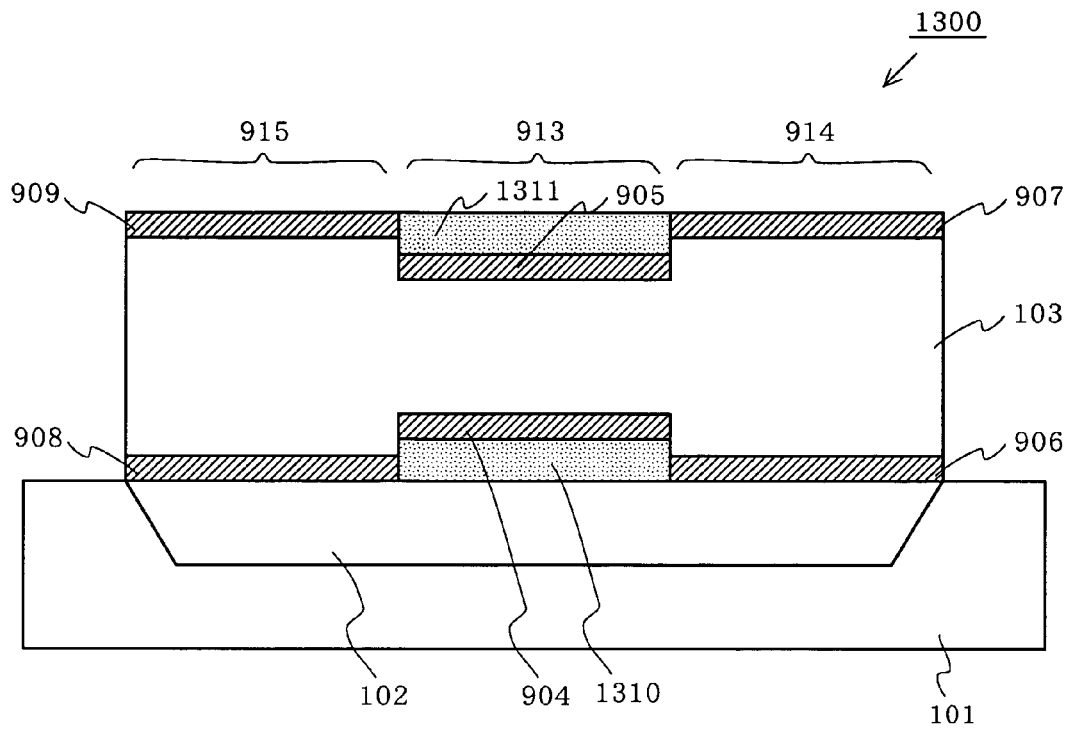
FIG. 18 is a cross-sectional view of a coupled FBAR filter 1300 according to a seventh embodiment of the present invention.

FIG. 18 is a cross-sectional view of a coupled FBAR filter 1300 according to a seventh embodiment of the present invention. As shown in FIG. 18, the coupled FBAR filter 1300 includes a substrate 101, a cavity 102, a piezoelectric thin film 103, a first lower electrode 904, a second lower electrode 906, a third lower electrode 908, a first upper electrode 905, a second upper electrode 907, a third upper electrode 909, a first insulator 1310, and a second insulator 1311. As can be seen from FIG. 18, the seventh embodiment is different from the fifth embodiment in the structure of the first and second insulators 1310 and 1311. In FIG. 18, elements having an identical function to those of the fifth embodiment bear the same reference numerals thereto and the descriptions thereof will be omitted.

The first lower electrode 904, the first upper electrode 905, and a part of the piezoelectric thin film 103 interposed between these electrodes form a first input/output vibration portion 913. The second lower electrode 906, the second upper electrode 907, and a part of the piezoelectric thin film 103 interposed between these electrodes form a second input/output vibration portion 914. The third lower electrode 908, the third upper electrode 909, and a part of the piezoelectric thin film 103 interposed between these electrodes form a third input/output vibration portion 915. The first insulator 1310 is formed only on a bottom surface of the first lower electrode 904. The thickness thereof is designed to fulfill the feature 2. The second insulator 1311 is formed only on a top surface of the first upper electrode 905. The thickness thereof is designed to fulfill the feature 3.

As described above, with the coupled FBAR filter 1300 according to the seventh embodiment of the present invention, the first through third input/output vibration portions 913 through 915 are formed in accordance with the structural features 1 through 4, so that the two vibration modes are efficiently coupled. As a result, the generated charge can be efficiently used, and smaller-loss and wider-band characteristics can be realized.

Figure 19:
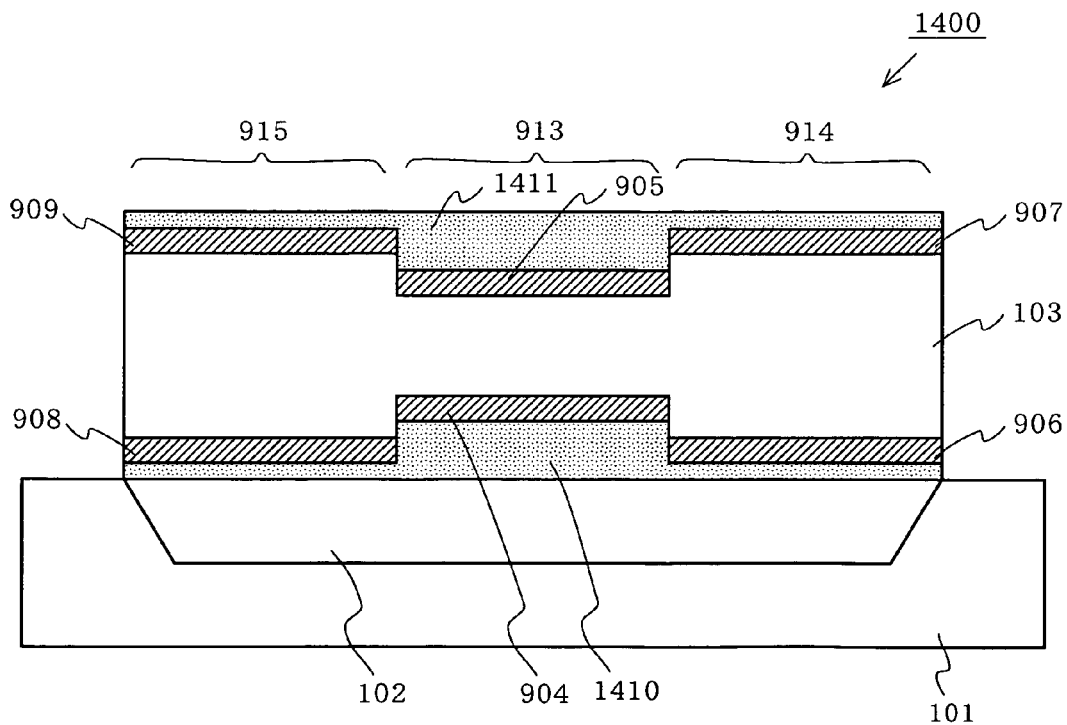
FIG. 19 is a cross-sectional view of a coupled FBAR filter 1400 as a modification of the seventh embodiment.

As a modification of the seventh embodiment, a coupled FBAR filter 1400 shown in FIG. 19, for example, is conceivable. The coupled FBAR filter 1400 includes a first insulator 1410 and a second insulator 1411 covering the first through third input/output vibration portions 913 through 915. The first insulator 1410 is obtained as a result of integrating an insulator having a certain thickness which is newly inserted on a bottom surface of the first through third input/output vibration portions 913 through 915 and the above-described first insulator 1310. The second insulator 1411 is obtained as a result of integrating an insulator having a certain thickness which is newly stacked on a top surface of the first through third input/output vibration portions 913 through 915 and the above-described second insulator 1311. The second insulator 1411 is sufficient as long as having a mass which makes the resonant frequencies of the first through third input/output vibration portions 913 through 915 generally equal to one another.

Eighth Embodiment

Figure 20:
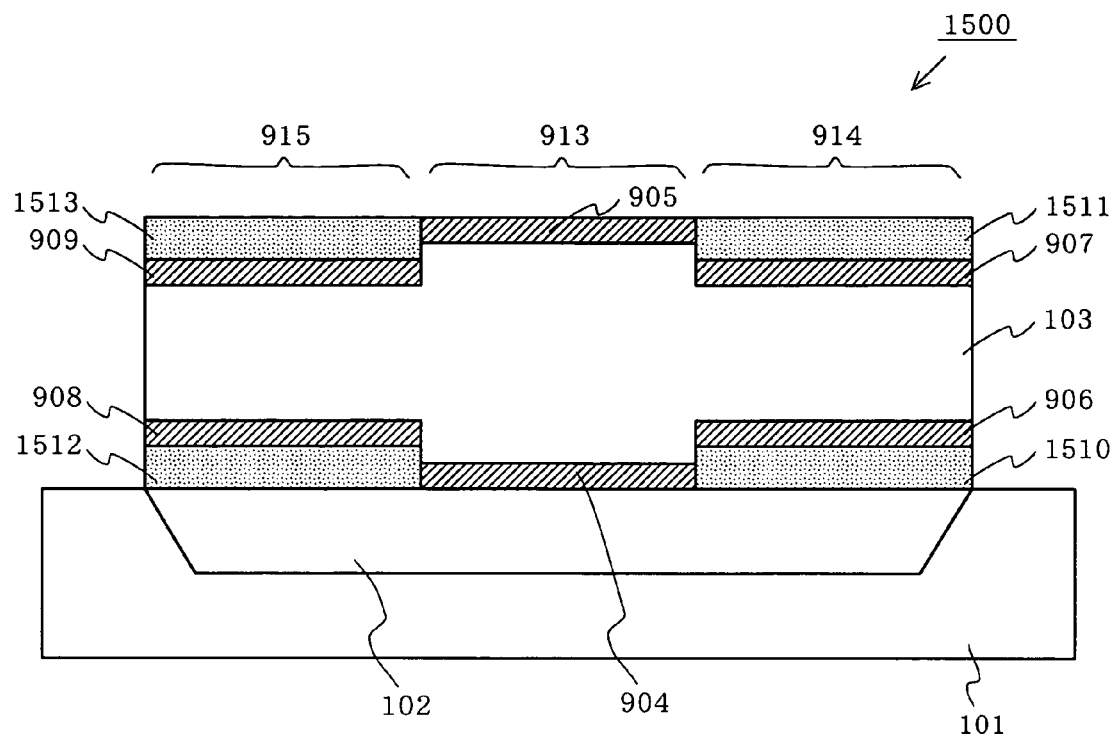
FIG. 20 is a cross-sectional view of a coupled FBAR filter 1500 according to an eighth embodiment of the present invention.

FIG. 20 is a cross-sectional view of a coupled FBAR filter 1500 according to an eighth embodiment of the present invention. As shown in FIG. 20, the coupled FBAR filter 1500 includes a substrate 101, a cavity 102, a piezoelectric thin film 103, a first lower electrode 904, a second lower electrode 906, a third lower electrode 908, a first upper electrode 905, a second upper electrode 907, a third upper electrode 909, a first insulator 1510, a second insulator 1511, a third insulator 1512, and a fourth insulator 1513. As can be seen from FIG. 20, the eighth embodiment is different from the fifth embodiment in the structure of the first through fourth insulators 1510 through 1513. In FIG. 20, elements having an identical function to those of the fifth embodiment bear the same reference numerals thereto and the descriptions thereof will be omitted.

The first lower electrode 904, the first upper electrode 905, and a part of the piezoelectric thin film 103 interposed between these electrodes form a first input/output vibration portion 913. The second lower electrode 906, the second upper electrode 907, and a part of the piezoelectric thin film 103 interposed between these electrodes form a second input/output vibration portion 914. The third lower electrode 908, the third upper electrode 909, and a part of the piezoelectric thin film 103 interposed between these electrodes form a third input/output vibration portion 915. The first insulator 1510 is formed only on a bottom surface of the second lower electrode 906. The third insulator 1512 is formed only on a bottom surface of the third lower electrode 908. The thicknesses of these insulators are designed to fulfill the feature 2. The second insulator 1511 is formed only on a top surface of the second upper electrode 907. The fourth insulator 1513 is formed only on a top surface of the third upper electrode 909. The thicknesses of these insulators are designed to fulfill the feature 3.

As described above, with the coupled FBAR filter 1500 according to the eighth embodiment of the present invention, the first through third input/output vibration portions 913 through 915 are formed in accordance with the structural features 1 through 4, so that the two vibration modes are efficiently coupled. As a result, the generated charge can be efficiently used, and smaller-loss and wider-band characteristics can be realized.

Figure 21:
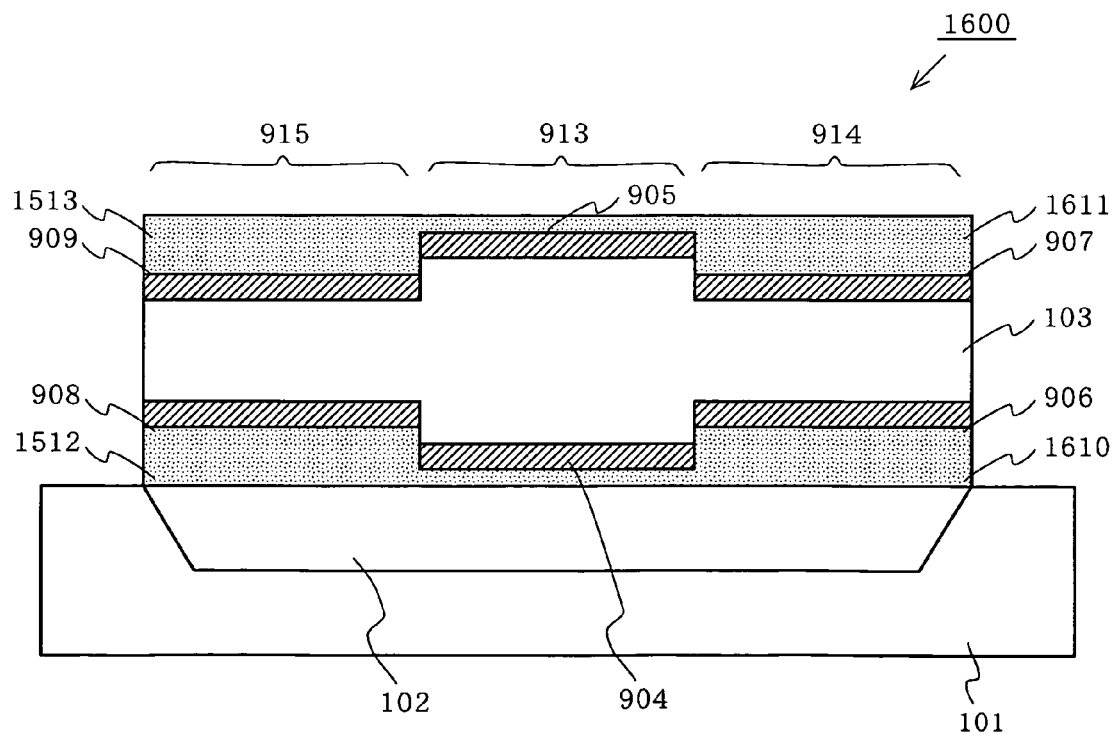
FIG. 21 is a cross-sectional view of a coupled FBAR filter 1600 as a modification of the eighth embodiment.

As a modification of the eighth embodiment, a coupled FBAR filter 1600 shown in FIG. 21, for example, is conceivable. The coupled FBAR filter 1600 includes a first insulator 1610 and a second insulator 1611 covering the first through third input/output vibration portions 913 through 915. The first insulator 1610 is obtained as a result of integrating an insulator having a certain thickness which is newly inserted on a bottom surface of the first through third input/output vibration portions 913 through 915 and the above-described first and third insulators 1510 and 1512. The second insulator 1611 is obtained as a result of integrating an insulator having a certain thickness which is newly stacked on a top surface of the first through third input/output vibration portions 913 through 915 and the above-described second and fourth insulators 1511 and 1513. The second insulator 1611 is sufficient as long as having a mass which makes the resonant frequencies of the first through third input/output vibration portions 913 through 915 generally equal to one another.

In the coupled FBAR filters described in the fifth through eighth embodiments, an acoustic mirror layer including a low acoustic impedance layer and a high acoustic impedance layer located alternately may be used instead of the cavity 102. Substantially the same effect is provided.

In the coupled FBAR filters described in the fifth through eighth embodiments, the second lower electrode 906 and the third upper electrode 909, or the second upper electrode 907 and the third lower electrode 908, may be balanced input/output terminal electrodes. With such a structure, a balanced coupled FBAR filter can be realized.

The coupled FBAR filters described in the fifth through eighth embodiments may have a concentric top surface. Specifically, a concentric coupled FBAR filter can be provided by forming an inner column-shaped piezoelectric resonator and an outer donut-shaped piezoelectric resonator.

Furthermore, the structure described in each of the second through fourth embodiments is applicable to the coupled FBAR filter described in each of the fifth through eighth embodiments.

Ninth Embodiment

In a ninth embodiment, exemplary applications of a coupled FBAR filter according to the present invention will be described.

Figure 23:
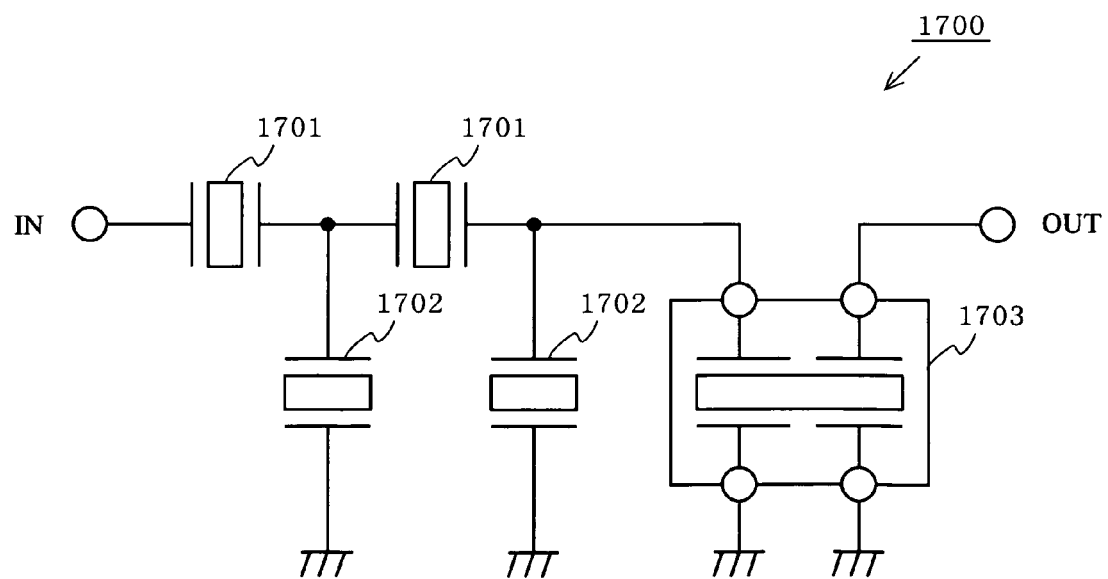
FIG. 23 is a circuit diagram of a ladder-type filter 1700 using a coupled FBAR filter according to the present invention.

FIG. 23 is a circuit diagram of a ladder-type filter 1700 using a coupled FBAR filter according to the present invention. As shown in FIG. 23, the ladder-type filter 1700 includes a plurality of FBAR filters 1701 connected in series, a plurality of FBAR filters 1702 connected in parallel to the plurality of FBAR filters 1701, and a coupled FBAR filter 1703 according to the present invention connected to an output. The FBAR filters 1701 and 1702 are not limited to being provided in the number shown in FIG. 23 as long as being connected in a ladder manner. The coupled FBAR filter 1703 is not limited to being connected at the position shown in FIG. 23.

In this manner, by connecting a coupled FBAR filter according to the present invention to a ladder type filter including FBAR filters, a filter having smaller-loss and wider-band characteristics can be realized.

Figure 24:
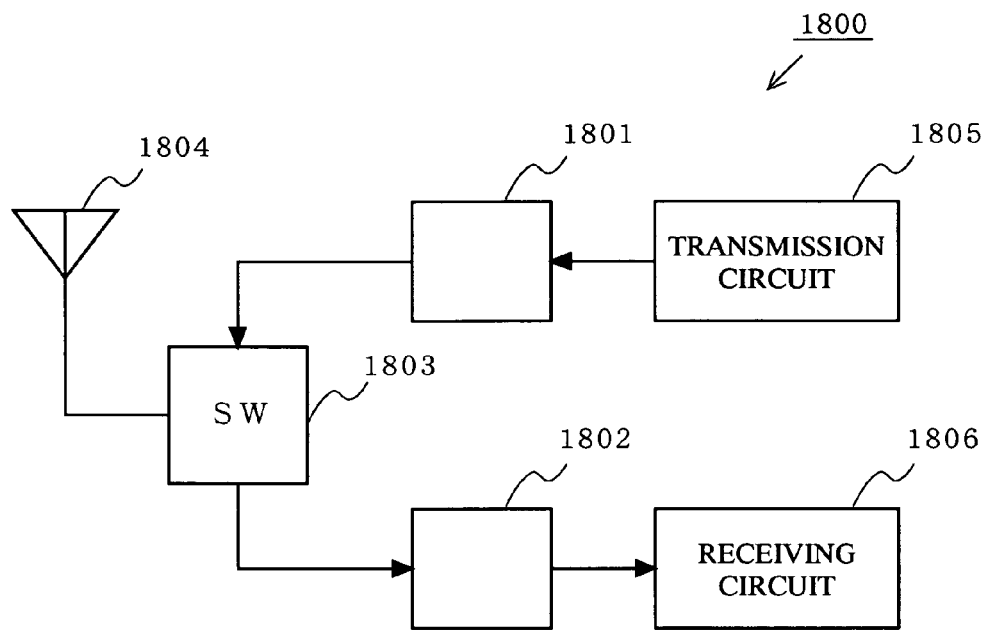
FIG. 24 is a block diagram showing a structure of a communication device 1800 using a coupled FBAR filter according to the present invention.

FIG. 24 is a block diagram showing a structure of a communication device 1800 using a coupled FBAR filter according to the present invention. As shown in FIG. 24, the communication device 1800 includes a transmission circuit 1805, a receiving circuit 1806, coupled FBAR filters 1801 and 1802 according to the present invention, a switching circuit 1803, and an antenna 1804. The coupled FBAR filter 1801 is connected between the transmission circuit 1805 and the switching circuit 1803, and has a characteristic of passing through a transmission frequency band. The coupled FBAR filter 1802 is connected between the receiving circuit 1806 and the switching circuit 1803, and has a characteristic of passing through a receiving frequency band. The switching circuit 1803 is switched either to propagate a signal from the transmission circuit 1805 toward the antenna 1804 or to propagate a signal from the antenna 1804 toward the receiving circuit 1806.

In this manner, by using a coupled FBAR filter according to the present invention for a communication device, a communication device having smaller-loss and wider-band characteristics can be realized.

Figure 25:
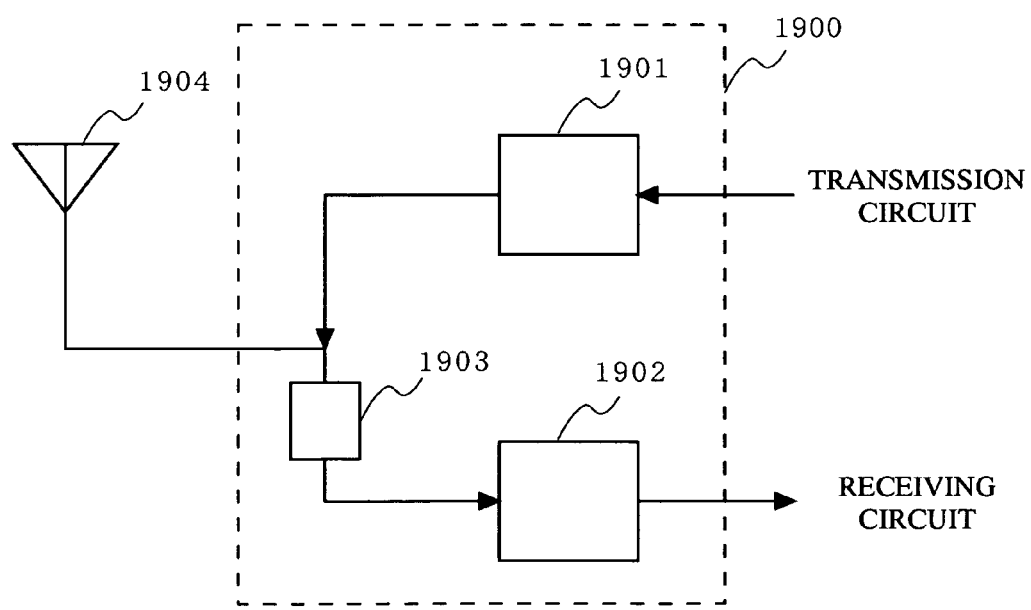
FIG. 25 is a block diagram showing a structure of a duplexer 1900 using a coupled FBAR filter according to the present invention.
Figure 26:
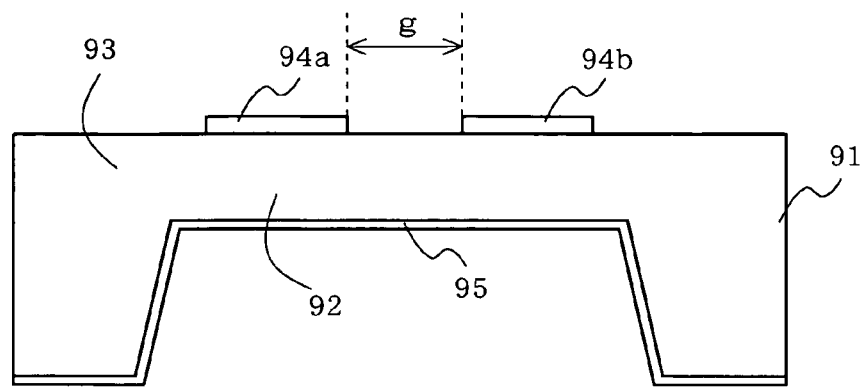
FIG. 26 shows a structure of a conventional MCF.
Figure 27:
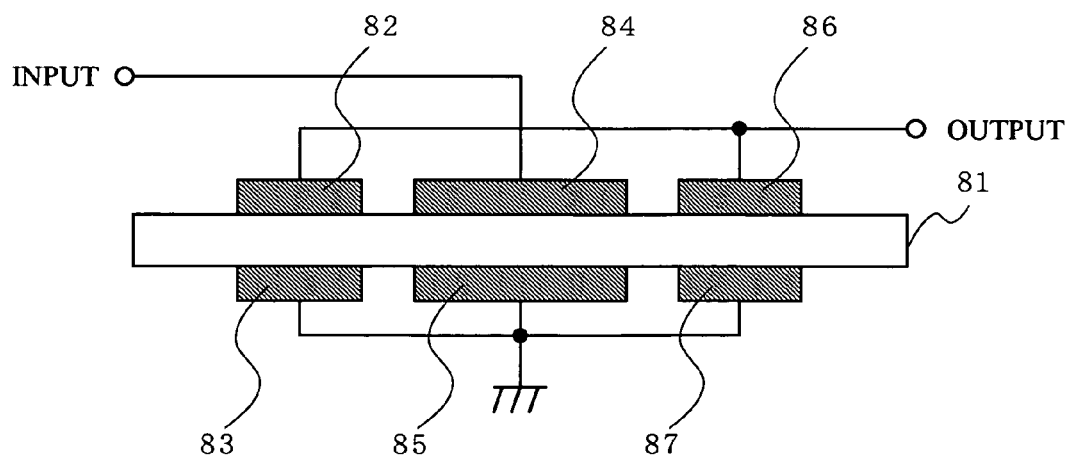
FIG. 27 shows a structure of another conventional MCF.
Figure 28:
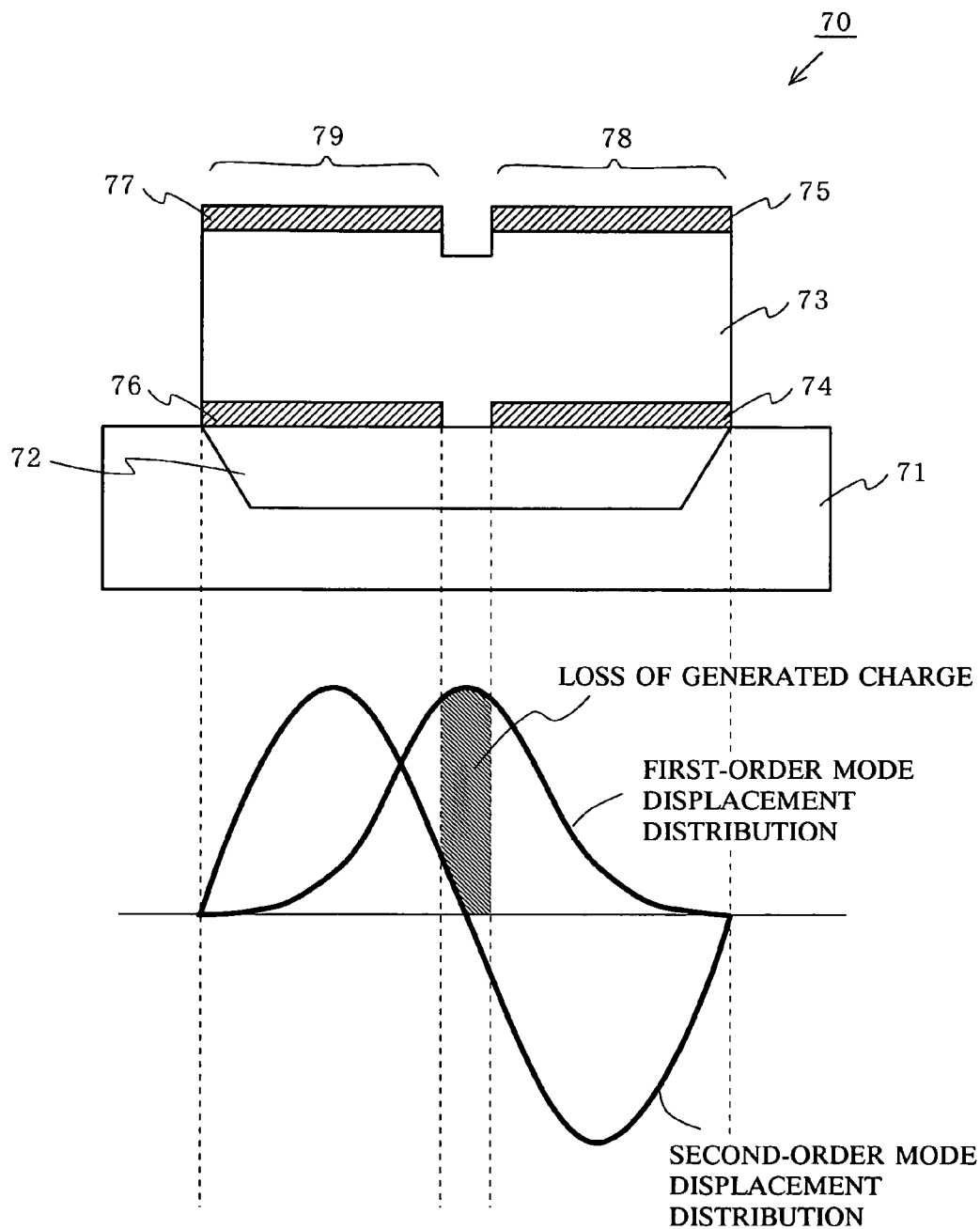
FIG. 28 shows a cross-sectional view of a conventional coupled FBAR filter 70 and ideal vibration mode distributions thereof.
Figure 29:
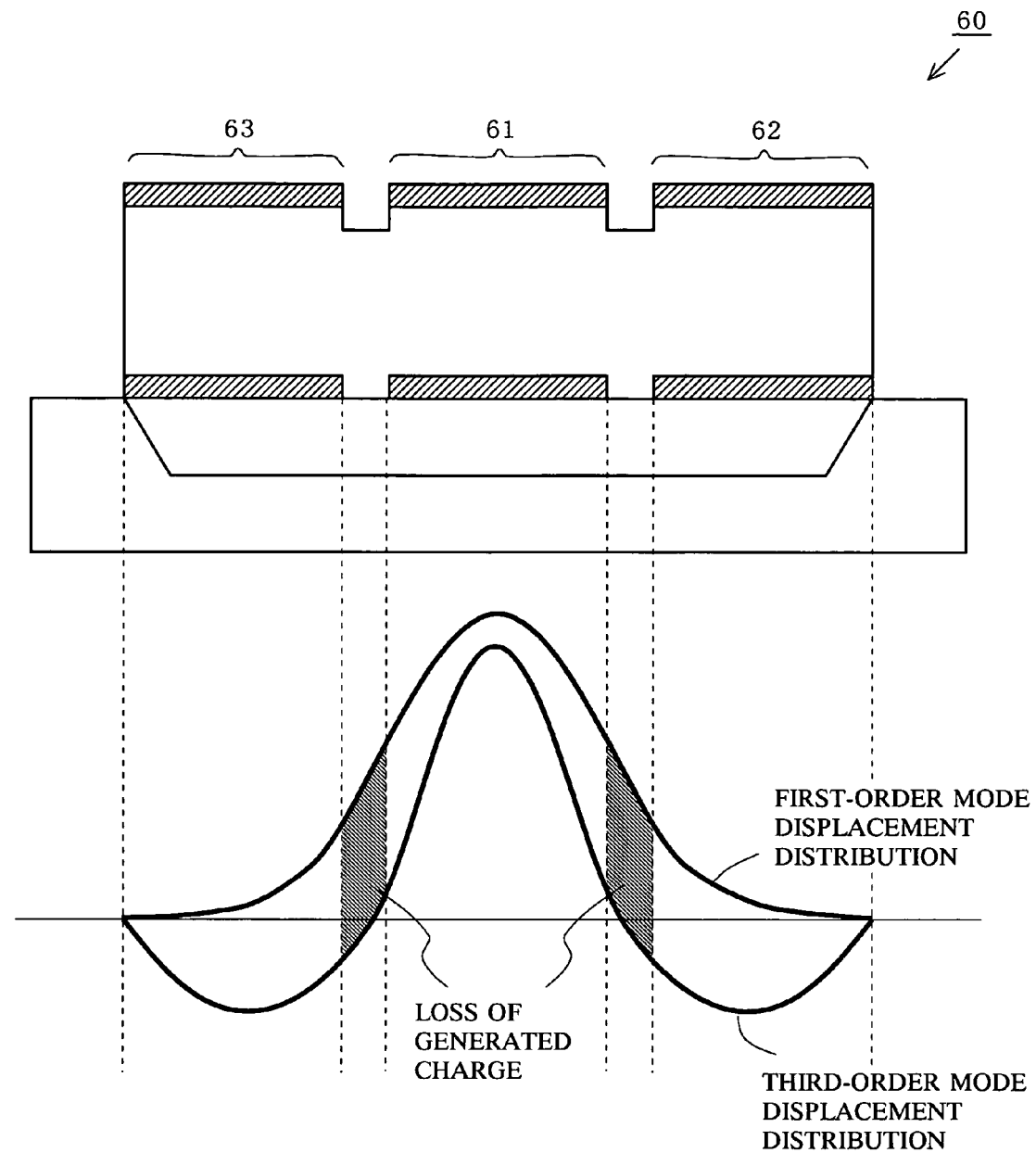
FIG. 29 shows a cross-sectional view of another conventional coupled FBAR filter and ideal vibration mode distributions thereof.

FIG. 25 is a block diagram showing a structure of a duplexer 1900 using a coupled FBAR filter according to the present invention. The duplexer 1900 includes a coupled FBAR filter 1901 according to the present invention connected on the side of a transmission circuit, a coupled FBAR filter 1902 according to the present invention connected on the side of a receiving circuit, and an isolation phase shifter 1903. The coupled FBAR filters 1901 and 1902 according to the present invention are, for example, the coupled FBAR filters 300 and 400 shown in FIG. 6 and FIG. 7.

Owing to the structure shown in FIG. 25, the coupled FBAR filter 1901 allows only a signal of a transmission frequency band to pass therethrough. The coupled FBAR filter 1902 allows only a signal of a receiving frequency band to pass therethrough. As a result, a transmission signal is radiated from an antenna 1904 without the transmission signal entering the receiving circuit, and a receiving signal from the antenna 1904 is propagated to the receiving circuit without entering the transmission circuit. Thus, a duplexer which has a smaller loss and is usable over a wider band can be realized.

A coupled FBAR filter according to the present invention is applicable to any device requiring a filter characteristic.

While the invention has been described in detail, the foregoing description is in all aspects illustrative and not restrictive. It is understood that numerous other modifications and variations can be devised without departing from the scope of the invention.

What is claimed is:

1. A coupled FBAR filter, comprising:
   a vibration portion including at least a first input/output vibration portion and a second input/output vibration portion which are located adjacently in contact with each other, wherein the first input/output vibration portion includes a first lower electrode, a first upper electrode, and a part of a piezoelectric portion interposed therebetween, and the second input/output vibration portion includes a second lower electrode, a second upper electrode, and a part of the piezoelectric portion interposed therebetween;
   a common vibration guaranteeing portion, having the vibration portion provided thereon, for commonly guaranteeing at least a vibration of the first input/output vibration portion and a vibration of the second input/output vibration portion so as to couple the plurality of vibrations; and
   at least one insulator for forming a stepped portion for electrically insulating at least either the first lower electrode and the second lower electrode from each other, or the first upper electrode and the second upper electrode from each other.

2. A coupled FBAR filter according to claim 1, wherein:
   a first insulator which is thicker than the second lower electrode of the second input/output vibration portion is provided below the first lower electrode of the first input/output vibration portion; and
   a second insulator which is thicker than the first upper electrode of the first input/output vibration portion is provided on the second upper electrode of the second input/output vibration portion.

3. A coupled FBAR filter according to claim 2, wherein the second insulator has a thickness for making resonant frequencies of the first and second input/output vibration portions generally equal to each other.

4. A coupled FBAR filter according to claim 2, wherein the second insulator is provided onto a top surface of the first upper electrode.

5. A coupled FBAR filter according to claim 4, wherein the second insulator has a mass for making resonant frequencies of the first and second input/output vibration portions generally equal to each other.

6. A coupled FBAR filter according to claim 2, wherein:
the first insulator is formed to have a shape insertable between the second lower electrode and the piezoelectric portion; and
the second insulator is formed to have a shape insertable between the first upper electrode and the piezoelectric portion.

7. A coupled FBAR filter according to claim 6, wherein the first and second insulators have a mass for making resonant frequencies of the first and second input/output vibration portions generally equal to each other.

8. A coupled FBAR filter according to claim 6, wherein the second insulator is provided onto a top surface of the first upper electrode.

9. A coupled FBAR filter according to claim 8, wherein the second insulator has a mass for making resonant frequencies of the first and second input/output vibration portions generally equal to each other.

10. A coupled FBAR filter according to claim 2, wherein:
the vibration portion further includes a third input/output vibration portion located adjacently in contact with the first input/output vibration portion and including a third lower electrode, a third upper electrode and a part of the piezoelectric portion interposed therebetween;
the common vibration guaranteeing portion commonly guarantees vibrations of the first through third input/output vibration portions so as to couple the plurality of vibrations;
a third insulator which is thicker than the first upper electrode of the first input/output vibration portion is provided on the third upper electrode of the third input/output vibration portion; and
the first insulator is formed to be thicker than the third lower electrode of the third input/output vibration portion.

11. A coupled FBAR filter according to claim 10, wherein the third insulator has a thickness for making resonant frequencies of the first and third input/output vibration portions generally equal to each other.

12. A coupled FBAR filter according to claim 10, wherein the second and third insulators are an integral layer provided onto the first upper electrode.

13. A coupled FBAR filter according to claim 12, wherein the second and third insulators have a mass for making resonant frequencies of the first through third input/output vibration portions generally equal to one another.

14. A coupled FBAR filter according to claim 1, wherein:
the first lower electrode of the first input/output vibration portion and the second lower electrode of the second input/output vibration portion are electrically connected to each other; and
an insulator which is thicker than the first upper electrode of the first input/output vibration portion is provided on the second upper electrode of the second input/output vibration portion.

15. A coupled FBAR filter according to claim 14, wherein the insulator has a thickness for making resonant frequencies of the first and second input/output vibration portions generally equal to each other.

16. A coupled FBAR filter according to claim 1, wherein the common vibration guaranteeing portion is a cavity formed in a substrate.

17. A coupled FBAR filter according to claim 1, wherein the common vibration guaranteeing portion is an acoustic mirror layer including a high acoustic impedance layer and a low acoustic impedance layer located alternately.

18. A ladder-type filter including a coupled FBAR filter which comprises:
a vibration portion including at least a first input/output vibration portion and a second input/output vibration portion which are located adjacently in contact with each other, wherein the first input/output vibration portion includes a first lower electrode, a first upper electrode, and a part of a piezoelectric portion interposed therebetween, and the second input/output vibration portion includes a second lower electrode, a second upper electrode, and a part of the piezoelectric portion interposed therebetween;
a common vibration guaranteeing portion, having the vibration portion provided thereon, for commonly guaranteeing at least a vibration of the first input/output vibration portion and a vibration of the second input/output vibration portion so as to couple the plurality of vibrations; and
at least one insulator for forming a stepped portion for electrically insulating at least either the first lower electrode and the second lower electrode from each other, or the first upper electrode and the second upper electrode from each other.

19. A duplexer including a coupled FBAR filter which comprises:
a vibration portion including at least a first input/output vibration portion and a second input/output vibration portion which are located adjacently in contact with each other, wherein the first input/output vibration portion includes a first lower electrode, a first upper electrode, and a part of a piezoelectric portion interposed therebetween, and the second input/output vibration portion includes a second lower electrode, a second upper electrode, and a part of the piezoelectric portion interposed therebetween;
a common vibration guaranteeing portion, having the vibration portion provided thereon, for commonly guaranteeing at least a vibration of the first input/output vibration portion and a vibration of the second input/output vibration portion so as to couple the plurality of vibrations; and
at least one insulator for forming a stepped portion for electrically insulating at least either the first lower electrode and the second lower electrode from each other, or the first upper electrode and the second upper electrode from each other.

20. A communication device including a coupled FBAR filter which comprises:
a vibration portion including at least a first input/output vibration portion and a second input/output vibration portion which are located adjacently in contact with each other, wherein the first input/output vibration portion includes a first lower electrode, a first upper electrode, and a part of a piezoelectric portion interposed therebetween, and the second input/output vibration portion includes a second lower electrode, a second upper electrode, and a part of the piezoelectric portion interposed therebetween;
a common vibration guaranteeing portion, having the vibration portion provided thereon, for commonly guaranteeing at least a vibration of the first input/output vibration portion and a vibration of the second input/output vibration portion so as to couple the plurality of vibrations; and at least one insulator for forming a stepped portion for electrically insulating at least either the first lower electrode and the second lower electrode from each other, or the first upper electrode and the second upper electrode from each other.

* * * * *